(12) United States Patent
Saito et al.

(10) Patent No.: US 11,561,468 B2
(45) Date of Patent: Jan. 24, 2023

(54) PATTERN FORMING METHOD

(71) Applicant: CANON KABUSHIKI KAISHA, Tokyo (JP)

(72) Inventors: Tomohiro Saito, Utsunomiya (JP); Toshiki Ito, Kawasaki (JP); Tomonori Otani, Fukui (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 331 days.

(21) Appl. No.: 16/776,674

(22) Filed: Jan. 30, 2020

(65) Prior Publication Data

US 2020/0166836 A1  May 28, 2020

Related U.S. Application Data

(63) Continuation of application No. PCT/JP2018/029246, filed on Aug. 3, 2018.

(30) Foreign Application Priority Data

Aug. 10, 2017  (JP) .............................. JP2017-155715

(51) Int. Cl.
 *G03F 7/00* (2006.01)
 *B29C 59/02* (2006.01)
 (Continued)

(52) U.S. Cl.
 CPC ............ *G03F 7/0002* (2013.01); *B29C 59/02* (2013.01); *B29C 59/16* (2013.01); (Continued)

(58) Field of Classification Search
 CPC ............... G03F 7/0002; C08F 22/1006; H05K 3/0079; H05K 3/0082; B29C 59/005; B29C 59/02; B29C 59/16
 See application file for complete search history.

(56) References Cited

U.S. PATENT DOCUMENTS 7,576,009 B2  8/2009 Lee et al.
8,536,270 B2  9/2013 Omatsu
(Continued)

FOREIGN PATENT DOCUMENTS

JP  2004-342337 A  12/2004
JP  2009-016000 A  1/2009
(Continued)

OTHER PUBLICATIONS

Office Action in Taiwanese Application No. 107127749 (dated Apr. 2019).

(Continued)

*Primary Examiner* — Mathieu D Vargot

(74) *Attorney, Agent, or Firm* — Venable LLP

(57) ABSTRACT

A pattern forming method comprises dispensing a curable composition onto an underlayer of a substrate; bringing the curable composition into contact with a mold; irradiating the curable composition with light to form a cured film; and separating the cured film from the mold. The proportion of the number of carbon atoms relative to the total number of atoms in the underlayer is 80% or more. The dispensing step comprises a first dispensing step of dispensing a curable composition (A1) substantially free of a fluorosurfactant onto the underlayer, and a second dispensing step of dripping a droplet of a curable composition (A2) having a fluorosurfactant concentration in components excluding a solvent of 1.1% by mass or less onto the curable composition (A1) discretely.

16 Claims, 2 Drawing Sheets

(51) Int. Cl.
  *B29C 59/16* (2006.01)
  *C08F 22/10* (2006.01)
  *H05K 3/00* (2006.01)
  G02B 5/18 (2006.01)
  G02B 5/30 (2006.01)

(52) U.S. Cl.
  CPC ....... *C08F 22/1006* (2020.02); *H05K 3/0079* (2013.01); *H05K 3/0082* (2013.01); *G02B 5/1852* (2013.01); *G02B 5/3025* (2013.01); *G02B 2207/101* (2013.01)

(56) References Cited

U.S. PATENT DOCUMENTS

| | | | |
|---|---|---|---|
| 9,263,289 | B2 | 2/2016 | Hattori et al. |
| 9,623,439 | B2 | 4/2017 | Ito et al. |
| 9,627,218 | B2 | 4/2017 | Horiguchi |
| 10,150,231 | B2 | 12/2018 | Ito et al. |
| RE47,456 | E | 6/2019 | Kobayashi |
| 10,395,943 | B2 | 8/2019 | Ito et al. |
| 10,488,753 | B2 | 11/2019 | Stachowiak et al. |
| 10,509,313 | B2 | 12/2019 | Liu et al. |
| 10,578,965 | B2 | 3/2020 | Iimura et al. |
| 10,668,677 | B2 | 6/2020 | Khusnatdinov et al. |
| 10,754,243 | B2 | 8/2020 | Ito |
| 10,754,244 | B2 | 8/2020 | Ito et al. |
| 10,754,245 | B2 | 8/2020 | Ito et al. |
| 10,829,644 | B2 | 11/2020 | Otani et al. |
| 10,845,700 | B2 | 11/2020 | Chiba et al. |
| 10,883,006 | B2 | 1/2021 | Chiba et al. |
| 10,935,884 | B2 | 3/2021 | Chiba et al. |
| 11,029,597 | B2 | 6/2021 | Goto et al. |
| 11,037,785 | B2 | 6/2021 | Kato et al. |
| 2009/0011367 | A1 | 1/2009 | Omatsu et al. |
| 2009/0085255 | A1 | 4/2009 | Tada et al. |
| 2015/0014819 | A1 | 1/2015 | Hattori et al. |
| 2016/0009946 | A1* | 1/2016 | Kitagawa ............ C09D 151/08 264/447 |
| 2017/0066208 | A1 | 3/2017 | Khusnatdinov et al. |
| 2017/0068159 | A1 | 3/2017 | Khusnatdinov et al. |
| 2017/0158905 | A1* | 6/2017 | Oomatsu ............... C08F 222/10 |
| 2017/0283620 | A1 | 10/2017 | Otani et al. |
| 2017/0283632 | A1 | 10/2017 | Chiba et al. |
| 2017/0285462 | A1 | 10/2017 | Ito |
| 2017/0285463 | A1 | 10/2017 | Ito et al. |
| 2017/0285464 | A1 | 10/2017 | Ito et al. |
| 2017/0285466 | A1 | 10/2017 | Chiba et al. |
| 2018/0042117 | A1* | 2/2018 | Ito ....................... H01L 21/0273 |
| 2018/0275511 | A1 | 9/2018 | Stachowiak et al. |
| 2019/0004421 | A1 | 1/2019 | Ito |
| 2019/0030785 | A1 | 1/2019 | Kato et al. |
| 2019/0377260 | A1 | 12/2019 | Otani et al. |
| 2019/0391484 | A1 | 12/2019 | Chiba et al. |
| 2019/0393026 | A1 | 12/2019 | Kato et al. |

FOREIGN PATENT DOCUMENTS

| | | |
|---|---|---|
| JP | 2010-258421 A | 11/2010 |
| JP | 2011-159924 A | 8/2011 |
| JP | 2012-169434 A | 9/2012 |
| JP | 2012-199360 A | 10/2012 |
| JP | 5065058 B2 | 10/2012 |
| JP | 2013-202982 A | 10/2013 |
| JP | 2014-515121 A | 6/2014 |
| JP | 5827180 B2 | 12/2015 |
| JP | 2016-157782 A | 9/2016 |
| JP | 2016-162862 A | 9/2016 |
| JP | 2016-162863 * | 9/2016 |
| JP | 2016-162863 A | 9/2016 |
| JP | 2017-055108 A | 3/2017 |
| JP | 2019-516249 A | 6/2019 |
| WO | 2012/131479 A1 | 10/2012 |
| WO | 2017/150261 A1 | 9/2017 |
| WO | 2018/005338 A1 | 1/2018 |
| WO | 2019/031409 A1 | 2/2019 |

OTHER PUBLICATIONS

International Preliminary Report on Patentability in International Application No. PCT/JP2018/029246 (dated Feb. 2020).
Non-Final Office Action in U.S. Appl. No. 16/150,939 (dated Jun. 2021).
Notice of Reasons for Refusal in Japanese Application No. 2018-150600 (dated Jun. 2022).
International Search Report in International Application No. PCT/JP2018/029246 (dated Oct. 2018).

* cited by examiner

FIG. 1A STEP [1]
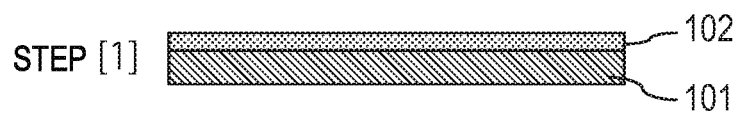
FIG. 1B STEP [2-1]
FIG. 1C STEP [2-2]
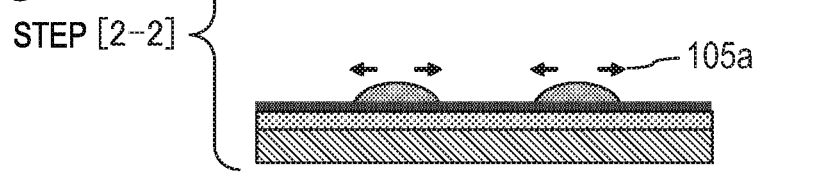
FIG. 1D STEP [3]
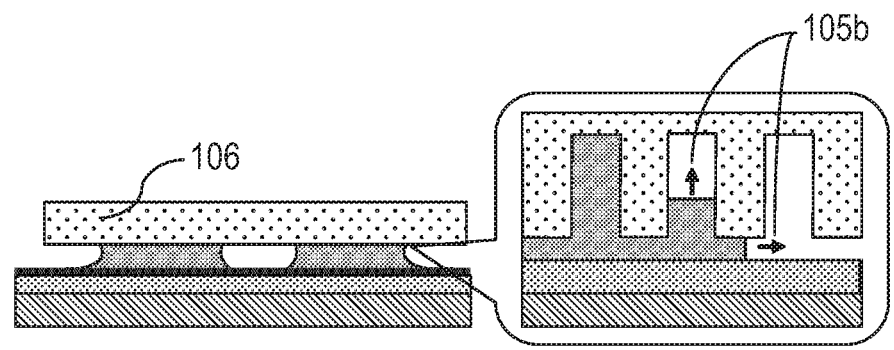
FIG. 1E STEP [4]
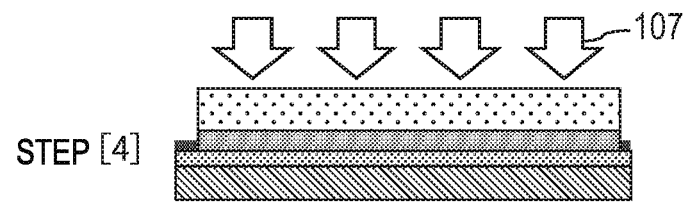
FIG. 1F STEP [5]
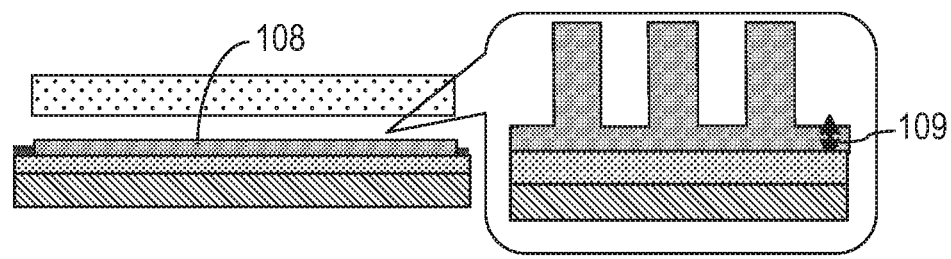

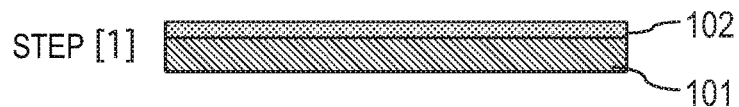
FIG. 2A  STEP [1]
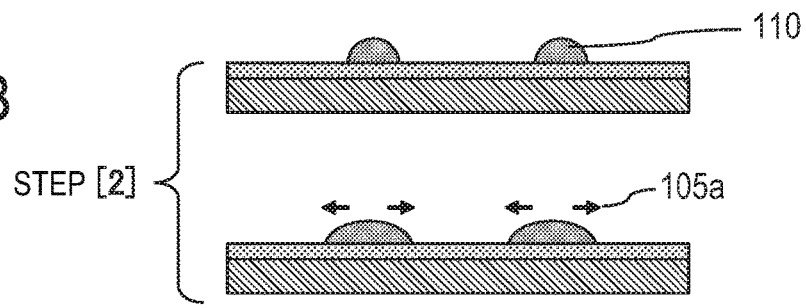
FIG. 2B  STEP [2]
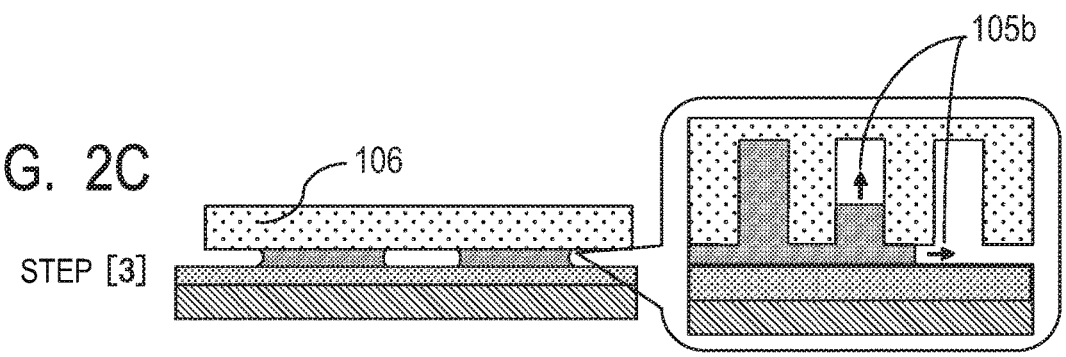
FIG. 2C  STEP [3]
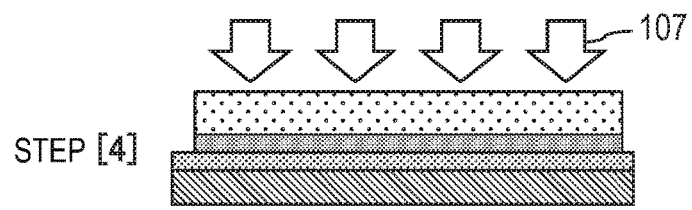
FIG. 2D  STEP [4]
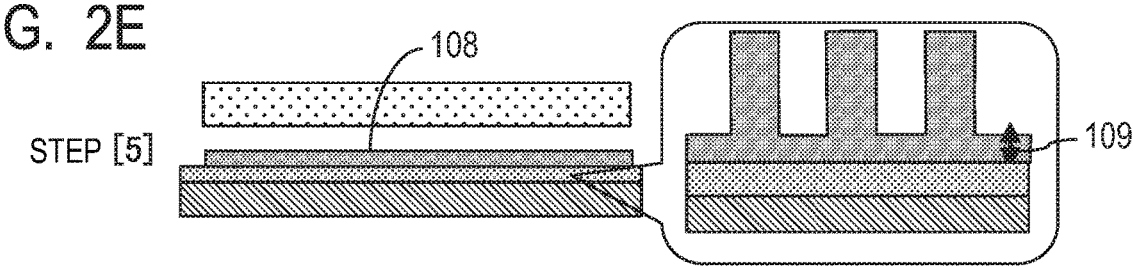
FIG. 2E  STEP [5]

PATTERN FORMING METHOD

CROSS-REFERENCE TO RELATED APPLICATIONS

This application is a Continuation of International Patent Application No. PCT/JP2018/029246, filed Aug. 3, 2018, which claims the benefit of Japanese Patent Application No. 2017-155715, filed Aug. 10, 2017, both of which are hereby incorporated by reference herein in their entirety.

BACKGROUND OF THE INVENTION

Field of the Invention

The present invention relates to a pattern forming method, a method for manufacturing a circuit board, a method for manufacturing an electronic instrument, and a method for manufacturing an optical component.

Description of the Related Art

In semiconductor devices, MEMS, and the like, there is an increasing demand for reducing the size, and optical nanoimprint technology is attracting attention as a microprocessing technique. In optical nanoimprint technology, a photocurable composition (a resist) is cured, with a mold having a fine uneven pattern on its surface being pressed against a substrate (a wafer) coated with the photocurable composition. Thereby, the uneven pattern of the mold is transferred to the cured film of the photocurable composition to form the pattern on the substrate. Optical nanoimprint technology is capable of forming a fine structure in the order of several nanometers on the substrate.

Optical nanoimprint technology is generally performed as follows. First, a liquid resist is dripped discretely onto a pattern forming region on a substrate using an inkjet method or the like (a dispensing step). At this time, droplets of the dripped resist slightly spread over the substrate, and this phenomenon is called pre-spreading. Next, this resist is shaped by pressing a mold having a pattern on the lower surface (a mold contacting step). In the mold contacting step, droplets of the resist spread throughout the gap between the substrate and the mold by capillary action. This phenomenon is called spreading. Moreover, in the mold contacting step, the resist also fills the inside of the depressions of the pattern formed on the lower surface of the mold by capillary action. This filling phenomenon is called filling. The time to the completion of spreading and filling is called a filling time. After the completion of resist filling, the resist is cured by being irradiated with light (a light irradiation step). At this time, in the case of emitting light from the mold side, a mold that is transparent to the emitted light is used. After the resist is cured, the mold is separated from the substrate (a mold releasing step). By carrying out these steps, a resist pattern (a photocured film) having a predetermined shape is formed on the substrate.

In the mold releasing step of optical nanoimprint technology, adhesion between the photocurable composition and the substrate is important. This is because, if adhesion between the photocurable composition and the substrate is poor, pattern peeling defects may occur wherein the photocured material obtained by curing the photocurable composition is partially peeled off and remain adhered to the mold when the mold is separated in the mold releasing step. Accordingly, as a technique for improving adhesion between the photocurable composition and the substrate, Japanese Patent Application Laid-Open No. 2013-202982 proposes a technique for forming an adhesion layer, which is a layer for adhering the photocurable composition and the substrate, between the photocurable composition and the substrate.

Meanwhile, in the current process of reducing the size of semiconductors, in addition to reducing the size, the resist is formed into a thin film. Moreover, an increased aspect ratio of a processing pattern causes a phenomenon of a lowered etching rate called a microloading effect and thus results in an increased etching time that a thin resist mask cannot withstand in some cases. Accordingly, in order to highly accurately form a fine pattern having a high aspect ratio, methods such as a multilayer resist process and an inversion process are used. In these methods, a resist pattern is once transferred to a layer that is different from a resist and that has high etching resistance (a high etching resistance layer), and then the target underlayer is processed using the high etching resistance layer as an etching mask. As a material of the high etching resistance layer, an organic material or a silicon material is commonly used, and SOC (spin-on carbon) containing carbon as a main component may be used as the organic material (Japanese Patent No. 5065058).

In nanoimprint pattern formation as well, a high etching resistance layer may be used and, for example, in an inversion process in nanoimprint, SOC is used as a high etching resistance layer (Japanese Patent Application Laid-Open No. 2016-162862). In the nanoimprint process on SOC, it is common to apply a nanoimprint adhesion layer material to SOC and perform imprint thereon (Japanese Patent No. 5827180).

According to Japanese Patent Application Laid-Open No. 2013-202982, an underlying film (an adhesion layer) formed of a composition containing a urea crosslinking agent is provided on the substrate surface to increase adhesion between the substrate and the photocured material in the mold releasing step. However, in order to prevent the photocured material from being peeled off from the substrate in the mold releasing step, not only adhesion between the substrate and the photocured material but also separability between the mold and the photocured material is important. On the other hand, in order to shorten the filling time in the mold contacting step, affinity (wettability) between the photocurable composition and the mold and substrate surfaces is also an important factor. That is to say, in optical nanoprint technology, wettability between the photocurable composition and the mold surface (and the substrate surface) and separability between the photocured material and the mold surface (and adhesion to the substrate surface) are simultaneously required. An object of the present invention is to provide a pattern forming method involving optical nanoprint technology that meets such requirements.

SUMMARY OF THE INVENTION

One embodiment of the pattern forming method of the present invention is a pattern forming method comprising in this order:

a dispensing step of dispensing a curable composition onto an underlayer of a substrate having the underlayer on a surface;

a mold contacting step of bringing the curable composition into contact with a mold;

a light irradiation step of irradiating the curable composition with light to form a cured film; and a mold releasing step of separating the cured film from the mold, wherein a proportion of the number of carbon atoms relative to the total number of atoms excluding hydrogen in the underlayer is 80% or more, and the dispensing step comprises a first dispensing step of dispensing a curable composition (A1) substantially free of a fluorosurfactant onto the underlayer, and a second dispensing step of dripping a droplet of a curable composition (A2) having a fluorosurfactant concentration in components excluding a solvent of 1.1% by mass or less onto the curable composition (A1) discretely.

Another embodiment of the pattern forming method of the present invention is a pattern forming method comprising in this order:

a dispensing step of dispensing a curable composition onto an underlayer of a substrate having the underlayer on a surface;

a mold contacting step of bringing the curable composition into contact with a mold;

a light irradiation step of irradiating the curable composition with light to form a cured film; and a mold releasing step of separating the cured film from the mold, wherein a proportion of the number of carbon atoms relative to the total number of atoms excluding hydrogen in the underlayer is 80% or more, and the dispensing step is a step of dispensing a curable composition having a fluorosurfactant concentration in components excluding a solvent of 0.26% by mass or less onto the underlayer.

Yet another embodiment of the pattern forming method of the present invention is a pattern forming method comprising in this order:

a dispensing step of directly dispensing a curable composition onto spin-on carbon of a substrate having the spin-on carbon on a surface;

a mold contacting step of bringing the curable composition on the substrate into contact with a mold such that the curable composition is sandwiched between the substrate and the mold;

a light irradiation step of irradiating the curable composition with light to form a cured film adhered to the spin-on carbon; and a mold releasing step of separating the cured film adhered to the spin-on carbon from the mold.

Further features of the present invention will become apparent from the following description of exemplary embodiments with reference to the attached drawings.

BRIEF DESCRIPTION OF THE DRAWINGS

FIG. 1A is a schematic cross-sectional view showing a pattern forming method according to a first embodiment.

FIG. 1B is a schematic cross-sectional view showing the pattern forming method according to the first embodiment.

FIG. 1C is a schematic cross-sectional view showing the pattern forming method according to the first embodiment.

FIG. 1D is a schematic cross-sectional view showing the pattern forming method according to the first embodiment.

FIG. 1E is a schematic cross-sectional view showing the pattern forming method according to the first embodiment.

FIG. 1F is a schematic cross-sectional view showing the pattern forming method according to the first embodiment.

FIG. 2A is a schematic cross-sectional view showing a pattern forming method according to a second embodiment.

FIG. 2B is a schematic cross-sectional view showing the pattern forming method according to the second embodiment.

FIG. 2C is a schematic cross-sectional view showing the pattern forming method according to the second embodiment.

FIG. 2D is a schematic cross-sectional view showing the pattern forming method according to the second embodiment.

FIG. 2E is a schematic cross-sectional view showing the pattern forming method according to the second embodiment.

DESCRIPTION OF THE EMBODIMENTS

Embodiments of the present invention will now be described in detail hereinbelow while suitably referring to the drawings. However, the present invention is not limited to the embodiments described below. Also, the embodiments described below may be suitably altered or modified based on common knowledge of those skilled in the art without departing from the scope of the present invention, and such embodiments are also encompassed within the scope of the present invention.

The inventors of the present invention have found that a resist firmly adheres to a carbon-based layer such as a SOC film without applying an adhesion layer. Accordingly, application of an adhesion layer to a carbon-based layer can be omitted. Omission of the step of applying an adhesion layer makes the adhesion layer material unnecessary, thus enabling the material cost and the process cost for application to be reduced. Moreover, defects resulting from the adhesion layer material and the application process can be eliminated, and the yield of device manufacture is increased accordingly. Also, the adhesion layer that is regarded as a part of a remaining film that remains after imprinting (109 in FIG. 1F and FIG. 2E) is eliminated, thus the substantive thickness of the remaining film is reduced, and numerous advantages such as an increased etching process margin in the subsequent step are provided.

However, dripping an imprint resist onto a carbon-based layer is problematic by taking a long time to fill the resist because the contact angle of the resist is large. That is to say, the present invention provides a pattern forming method with which the contact angle of a resist dripped onto a carbon-based layer such as SOC is small, the filling rate is high, and pattern peeling does not occur.

First Embodiment

[Curable Compositions]

Curable compositions (A1) and (A2) according to the present embodiment are compositions having at least a component (a) that is a polymerizable compound. The curable compositions according to the present embodiment may further contain a component (b) that is a photopolymerization initiator, a component (c) that is a non-polymerizable compound such as an internal release agent, and a component (d) that is a solvent.

The cured film herein means a film cured by polymerizing the curable compositions on a substrate. The form of the cured film is not particularly limited, and the cured film may have a patterned surface.

<Component (a): Polymerizable Compound>

The component (a) is a polymerizable compound. The polymerizable compound herein is a compound that reacts with a polymerization factor (such as a radical) generated from a photopolymerization initiator (the component (b)) and forms a film composed of a polymer compound by a chain reaction (a polymerization reaction).

Such a polymerizable compound is, for example, a radically polymerizable compound. The polymerizable compound as the component (a) may be composed solely of one polymerizable compound, or may be composed of a plurality of polymerizable compounds.

The radically polymerizable compound is preferably a compound having one or more acryloyl groups or methacryloyl groups, i.e., a (meth)acrylic compound. Thus, preferably the curable composition according to the present embodiment contains a (meth)acrylic compound as the component (a), more preferably the primary constituent of the component (a) is a (meth)acrylic compound, and most preferably the entirety of the component (a) is a (meth)acrylic compound. That the primary constituent of the component (a) is a (meth)acrylic compound as described here indicates that 90% by mass or more of the component (a) is a (meth)acrylic compound.

When the radically polymerizable compound is composed of a plurality of compounds having one or more acryloyl groups or methacryloyl groups, a monofunctional (meth)acrylic monomer and a polyfunctional (meth)acrylic monomer are preferably contained. This is because a combination of a monofunctional (meth)acrylic monomer and a polyfunctional (meth)acrylic monomer yields a cured film having high mechanical strength.

Examples of the monofunctional (meth)acrylic compound having one acryloyl group or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, (meth)acrylate of EO-modified p-cumylphenol, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenylether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, isobutoxymethyl (meth)acrylamide, N,N-dimethyl (meth)acrylamide, t-octyl (meth)acrylamide, dimethyl aminoethyl (meth)acrylate, diethyl aminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercially available products of the monofunctional (meth)acrylic compound include, but are not limited to, Aronix(R) M101, M102, M110, M111, M113, M117, M5700, TO-1317, M120, M150, and M156 (which are manufactured by Toagosei Co., Ltd.), MEDOL 10, MIBDOL 10, CHDOL 10, MMDOL 30, MEDOL 30, MIBDOL 30, CHDOL 30, LA, IBXA, 2-MTA, HPA, Viscoat #150, #155, #158, #190, #192, #193, #220, #2000, #2100, and #2150 (which are manufactured by Osaka Organic Chemical Industry Ltd.), Light Acrylate BO-A, EC-A, DMP-A, THF-A, HOP-A, HOA-MPE, HOA-MPL, PO-A, P-200A, NP-4EA, NP-BEA, and Epoxy Ester M-600A (which are manufactured by Kyoeisha Chemical Co., Ltd.), KAYARAD(R) TC110S, R-564, and R-128H (which are manufactured by Nippon Kayaku Co., Ltd.), NK Ester AMP-10G and AMP-20G (which are manufactured by Shin-Nakamura Chemical Co., Ltd.), FA-511A, 512A, and 513A (which are manufactured by Hitachi Chemical Co., Ltd.), PHE, CEA, PHE-2, PHE-4, BR-31, BR-31M, and BR-32 (which are manufactured by Dai-Ichi Kogyo Seiyaku Co., Ltd.), VP (which is manufactured by BASF), and ACMO, DMAA, and DMAPAA (which are manufactured by Kohj in Co., Ltd.).

Examples of the polyfunctional (meth)acrylic compound having two or more acryloyl groups or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethylol tricyclodecane di(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantanedimethanol di(meth)acrylate, tris(2-hydroxyethyl)isocyanurate tri(meth)acrylate, tris(acryloyloxy) isocyanurate, bis(hydroxymethyl) tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercially available products of the polyfunctional (meth)acrylic compound include, but are not limited to, Yupimer(R) UV SA1002 and SA2007 (which are manufactured by Mitsubishi Chemical Corporation), Viscoat #195, #230, #215, #260, #335HP, #295, #300, #360, #700, GPT, and 3PA (which are manufactured by Osaka Organic Chemical Industry Ltd.), Light Acrylate 4EG-A, 9EG-A, NP-A, DCP-A, BP-4EA, BP-4PA, TMP-A, PE-3A, PE-4A, and DPE-6A (which are manufactured by Kyoeisha Chemical Co., Ltd.), KAYARAD(R) PET-30, TMPTA, R-604, DPHA, DPCA-20, -30, -60, -120, HX-620, D-310, and D-330 (which are manufactured by Nippon Kayaku Co., Ltd.), Aronix(R) M208, M210, M215, M220, M240, M305, M309, M310, M315, M325, and M400 (which are manufactured by Toagosei Co., Ltd.), and Lipoxy(R) VR-77, VR-60, and VR-90 (which are manufactured by Showa Highpolymer Co., Ltd.).

In the group of compounds described above, (meth)acrylate means acrylate or methacrylate having an alcohol residue equivalent thereto. The (meth)acryloyl group means an acryloyl group or a methacryloyl group having an alcohol residue equivalent thereto. EO represents ethylene oxide, and an EO-modified compound A represents a compound in which the (meth)acrylic acid residue and the alcohol residue of a compound A are bonded via a block structure of an ethylene oxide group. PO represents propylene oxide, and a PO-modified compound B represents a compound in which the (meth)acrylic acid residue and the alcohol residue of a compound B are bonded via a block structure of a propylene oxide group.

<Component (b): Photopolymerization Initiator>

The component (b) is a photopolymerization initiator. The photopolymerization initiator herein is a compound that senses light having a predetermined wavelength and generates the aforementioned polymerization factor (a radical). Specifically, the photopolymerization initiator is a polymerization initiator (a radical generator) that generates a radical due to light (infrared rays, visible rays, ultraviolet rays, far ultraviolet rays, X-rays, charged particle rays such as electron rays, and radioactive rays). The component (b) may be composed of one photopolymerization initiator or may be composed of a plurality of photopolymerization initiators.

Examples of the radical generator include, but are not limited to, optionally substituted 2,4,5-triarylimidazole dimers such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone and benzophenone derivatives such as N,N'-tetramethyl-4,4'-diaminobenzophenone (Michler ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives such as 2-benzyl-2-dimethylamino-1-(4-morpholinophenyl)-butanone-1,2-methyl-1-[4-(methylthio)phenyl]-2-morpholino-propan-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenantharaquinone, 2-methyl-1,4-naphthoquinone, and 2,3-dimethylanthraquinone; benzoin ether derivatives such as benzoin methylether, benzoinethylether, and benzoin phenylether; benzoin and benzoin derivatives such as methylbenzoin, ethylbenzoin, and propylbenzoin; benzyl derivatives such as benzyldimethyl ketal; acridine derivatives such as 9-phenylacridine and 1,7-bis(9,9'-acridinyl)heptane; N-phenylglycine derivatives such as N-phenylglycine; acetophenone and acetophenone derivatives such as 3-methylacetophenone, acetophenone benzyl ketal, 1-hydroxycyclohexyl phenyl ketone, and 2,2-dimethoxy-2-phenylacetophenone; thioxanthone and thioxanthone derivatives such as diethylthioxanthone, 2-isopropylthioxanthone, and 2-chlorothioxanthone; acylphosphine oxide derivatives such as 2,4,6-trimethylbenzoyldiphenylphosphine oxide, bis(2,4,6-trimethylbenzoyl)phenylphosphine oxide, and bis-(2,6-dimethoxybenzoyl)-2,4,4-trimethylpentylphosphine oxide; oxime ester derivatives such as 1,2-octanedione, 1-[4-(phenylthio)-, 2-(O-benzoyloxime)] and ethanone, 1-[9-ethyl-6-(2-methylbenzoyl)-9H-carbazol-3-yl]-, 1-(O-acetyloxime); xanthone, fluorenone, benzaldehyde, fluorene, anthraquinone, triphenyl amine, carbazole, 1-(4-isopropylphenyl)-2-hydroxy-2-methylpropan-1-one, and 2-hydroxy-2-methyl-1-phenylpropan-1-one.

Examples of commercially available products of the radical generator include, but are not limited to, Irgacure 184, 369, 651, 500, 819, 907, 784, and 2959, CGI-1700, -1750, and -1850, CG24-61, Darocur 1116 and 1173, Lucirin(R) TPO, and LR8893 and LR8970 (which are manufactured by BASF); and Ubekrill P36 (manufactured by UCB).

Among these, the component (b) is preferably an acyl phosphine oxide polymerization initiator. Among the above examples, acylphosphine oxide polymerization initiators are acylphosphine oxide compounds such as 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide.

In the present embodiment, preferably the curable composition (A1) has substantially no photoreactivity. Accordingly, the proportion of the component (b) contained in the curable composition (A1) is preferably less than 0.1% by mass, more preferably 0.01% by mass or less, and even more preferably 0.001% by mass or less based on the total of the component (a), the component (b), and the component (c) which will be described below, or that is to say, the total mass of all components but the solvent component (d). With the proportion of the component (b) contained being less than 0.1% by mass, the curable composition (A1) has substantially no photoreactivity. Accordingly, photocuring due to leaking light does not occur, and a pattern barely having no-fill defects can be obtained even in a short filling time also in an adjacent shot. The curing reaction of the curable composition (A1) in the shot will be described below.

The proportion of the component (b) contained in the curable composition (A2) is preferably 0.1% by mass or more and 50% by mass or less, more preferably 0.1% by mass or more and 20% by mass or less, even more preferably 1% by mass or more and 20% by mass or less based on the total of the component (a), the component (b), and the component (c) which will be described below, or that is to say, the total mass of all components but the solvent component (d). With the proportion of the component (b) contained being 0.1% by mass or more, the curing rate of the composition is increased, thus enabling the reaction efficiency to be improved, and with the proportion being 50% by mass or less, the resulting cured film can be a cured film having a certain level of mechanical strength.

<Component (c): Non-Polymerizable Compound>

The curable compositions (A1) and (A2) according to the present embodiment can further contain, in addition to the component (a) and the component (b) described above, a non-polymerizable compound as the component (c) depending on various purposes as long as the effects of the present embodiment are not impaired. The component (c) may be a compound that neither has a polymerizable functional group such as a (meth)acryloyl group nor has the ability to sense light having a predetermined wavelength and generate the above polymerization factor (a radical). Examples include sensitizers, hydrogen donors, internal release agents, antioxidants, polymer components, and other additives. A plurality of the above compounds may be contained as components (c).

A sensitizer is a compound suitably added to promote the polymerization reaction and increase the reaction conversion rate. One sensitizer may be used singly, or two or more may be used as a mixture.

Examples of sensitizers include sensitizing dyes. A sensitizing dye is a compound that is excited by absorbing light having a specific wavelength and interacts with a photopolymerization initiator that is the component (b). The interaction as set forth here is energy transfer, electron transfer, or the like from an excited sensitizing dye to a photopolymerization initiator that is the component (b). Specific examples of sensitizing dyes include, but are not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

A hydrogen donor is a compound that generates a more reactive radical by reacting with an initiation radical generated from a photopolymerization initiator that is the component (b) or with a radical at a polymerization growth terminal. The hydrogen donor is preferably added when a photopolymerization initiator that is the component (b) is a photoradical generator.

Specific examples of such hydrogen donors include, but are not limited to, amine compounds such as n-butylamine, di-n-butylamine, tri-n-butylphosphine, allylthiourea, s-benzylisothiuronium-p-toluenesulfinate, triethylamine, diethylaminoethyl methacrylate, tri ethyl enetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine, and mercapto compounds such as 2-mercapto-N-phenylbenzimidazole and mercaptopropionic acid ester. One hydrogen donor may be used singly, or two or more may be used as a mixture. The hydrogen donor may function as a sensitizer.

An internal release agent can be added to the curable compositions in order to reduce bonding strength at the interface between the mold and the resist, i.e., to reduce a mold releasing force in the mold releasing step which will be described below. Internal herein means that the release agent is added in advance to the curable compositions before the step of dispensing the curable compositions. As internal release agents, usable are surfactants such as a silicone surfactant, a fluorosurfactant, and a hydrocarbon surfactant, and the like. However, as will be described below, the amount of the fluorosurfactant added is limited in the present embodiment. In the present embodiment, the internal release agent is not polymerizable. One internal release agent may be used singly, or two or more may be used as a mixture.

Examples of the fluorosurfactant include polyalkylene oxide (such as polyethylene oxide or polypropylene oxide) adducts of alcohols having a perfluoroalkyl group, and polyalkylene oxide (such as polyethylene oxide or polypropylene oxide) adducts of perfluoropolyether. The fluorosurfactant may have a hydroxyl group, an alkoxy group, an alkyl group, an amino group, a thiol group, or the like as a part (for example, a terminal group) of the molecular structure. Examples include pentadecaethylene glycol mono-1H, 1H,2H,2H-perfluorooctylether.

A commercially available fluorosurfactant may be used. Examples of commercially available products include Megafac(R) F-444, TF-2066, TF-2067, and TF-2068, and what is abbreviated as DEO-15 (which are manufactured by DIC Corporation), Fluorad FC-430 and FC-431 (which are manufactured by Sumitomo 3M Limited), Surflon(R) S-382 (manufactured by AGC Inc.), EFTOP EF-122A, 122B, 122C, EF-121, EF-126, EF-127, and MF-100 (which are manufactured by Tohchem Products), PF-636, PF-6320, PF-656, and PF-6520 (which are manufactured by OMNOVA Solutions Inc.), Unidyne(R) DS-401, DS-403, and DS-451 (which are manufactured by Daikin Industries, Ltd.), and Ftergent(R) 250, 251, 222F, and 208G (which are manufactured by Neos Company Limited).

The internal release agent may be a hydrocarbon surfactant. Examples of the hydrocarbon surfactant include alkyl alcohol polyalkylene oxide adducts obtained by adding alkylene oxide having 2 to 4 carbon atoms to alkyl alcohol having 1 to 50 carbon atoms, and polyalkylene oxides.

Examples of alkyl alcohol polyalkylene oxide adducts include a methyl alcohol ethylene oxide adduct, a decyl alcohol ethylene oxide adduct, a lauryl alcohol ethylene oxide adduct, a cetyl alcohol ethylene oxide adduct, a stearyl alcohol ethylene oxide adduct, and a stearyl alcohol ethylene oxide/propylene oxide adduct. The terminal group of the alkyl alcohol polyalkylene oxide adducts is not limited to a hydroxyl group that can be produced by simply adding polyalkylene oxide to alkyl alcohol. This hydroxyl group may be replaced by another substituent such as a polar functional group such as a carboxyl group, an amino group, a pyridyl group, a thiol group, or a silanol group, or a hydrophobic functional group such as an alkyl group or an alkoxy group.

Examples of polyalkylene oxide include polyethylene glycol, polypropylene glycol, and mono or dimethylether, mono or dioctylether, mono or dinonylether, mono or didecylether, monoadipic acid ester, monooleic acid ester, monostearic acid ester, and monosuccinic acid ester thereof.

A commercially available alkyl alcohol polyalkylene oxide adduct may be used. Examples of commercially available products include polyoxyethylene methyl ether (methyl alcohol ethylene oxide adduct) (BLAUNON MP-400, MP-550, and MP-1000) manufactured by Aoki Oil Industrial Co., Ltd., polyoxyethylene decylether (decyl alcohol ethylene oxide adduct) (FINESURF D-1303, D-1305, D-1307, and D-1310) manufactured by Aoki Oil Industrial Co., Ltd., polyoxyethylene laurylether (lauryl alcohol ethylene oxide adduct) (BLAUNON EL-1505) manufactured by Aoki Oil Industrial Co., Ltd., polyoxyethylene cetylether (cetyl alcohol ethylene oxide adduct) (BLAUNON CH-305 and CH-310) manufactured by Aoki Oil Industrial Co., Ltd., polyoxyethylene stearylether (stearyl alcohol ethylene oxide adduct) (BLAUNON SR-705, SR-707, SR-715, SR-720, SR-730, and SR-750) manufactured by Aoki Oil Industrial Co., Ltd., randomly polymerized polyoxyethylene polyoxypropylene stearyl ether (BLAUNON SA-50/50 1000R and SA-30/70 2000R) manufactured by Aoki Oil Industrial Co., Ltd., polyoxyethylene methylether (Pluriol(R) A760E) manufactured by BASF, and polyoxyethylene alkylether (Emulgen Series) manufactured by Kao Corporation. A commercially available polyalkylene oxide may be used, and examples include an ethylene oxide/propylene oxide copolymer (Pluronic PE6400) manufactured by BASF.

A fluorosurfactant exerts an excellent mold releasing force reducing effect and is thus effective as an internal release agent. However, the present inventors have found that a curable composition containing more than a certain amount of a fluorosurfactant has a large contact angle due to a pinning effect on an underlayer having a proportion of the number of carbon atoms of 80% or more and, in particular, a SOC film. Unless this pinning effect is suppressed to retain a small contact angle, the filling time (the spreading time) during which the curable compositions enter the gap between the substrate and the mold is prolonged, and the throughput of the imprint process is impaired. Performing the imprint process in a short filling time results in a large number of defects in which the imprinted uneven pattern is not filled with the curable compositions.

For the above reasons, the curable composition (A1) is substantially free of a fluorosurfactant in the present embodiment. Here, the phrase "substantially free" means that the content in the components excluding the solvent is 0.1% by mass or less and preferably 0.05% by mass or less. The amount of the fluorosurfactant in the components of the curable composition (A2) excluding the solvent is 1.1% by mass or less and preferably 0.51% by mass or less. With the amount of the fluorosurfactant added being as described above, the contact angles of the curable compositions can be reduced.

The proportion of the component (c) contained in the curable compositions excluding the fluorosurfactant is preferably 0% by mass or more and 50% by mass or less based on the total of the component (a), the component (b), and the component (c), or that is to say, the total mass of all components but the solvent. The proportion is more preferably 0.1% by mass or more and 50% by mass or less and even more preferably 0.1% by mass or more and 20% by mass or less. With the proportion of the component (c) contained being 50% by mass or less excluding the fluorosurfactant, the resulting cured film can be a cured film having a certain level of mechanical strength.

<Component (d): Solvent>

The curable compositions according to the present embodiment may contain a solvent as the component (d). The component (d) is not particularly limited as long as it is a solvent that dissolves the component (a), the component (b), and the component (c). A preferable solvent is a solvent having a boiling point of 80° C. or higher and 200° C. or lower at normal pressure. More preferably, it is a solvent having at least one of an ester structure, a ketone structure, a hydroxyl group, and an ether structure. Specifically, the solvent is one selected from the group consisting of propylene glycol monomethylether acetate, propylene glycol monomethylether, cyclohexanone, 2-heptanone, γ-butyrolactone, and ethyl lactate, or a mixed solvent thereof.

The curable composition (A1) according to the present embodiment preferably contains the component (d). This is because the method for applying the curable composition (A1) to a substrate is preferably a spin coating method as will be described below.

<Temperature when Formulating Curable Compositions>

When preparing the curable compositions (A1) and (A2) of the present embodiment, at least the component (a) and the component (b) are mixed and dissolved under predetermined temperature conditions. Specifically, the mixing and dissolution is performed in a range of 0° C. or higher and 100° C. or lower. The same applies when the component (c) and the component (d) are contained.

<Viscosities of Curable Compositions>

The curable compositions (A1) and (A2) according to the present embodiment are preferably liquid. This is because the spreading and filling of the curable composition (A1) and/or (A2) promptly complete, or that is to say, the filling time is short, in the mold contacting step which will be described below.

The viscosity at 25° C. of the mixture of components excluding the solvent (the component (d)) of the curable composition (A1) according to the present embodiment is preferably 1 mPa·s or more and 1000 mPa·s or less, more preferably 1 mPa·s or more and 500 mPa·s or less, and even more preferably 1 mPa·s or more and 100 mPa·s or less.

The viscosity at 25° C. of the mixture of components excluding the solvent (the component (d)) of the curable composition (A2) according to the present embodiment is preferably 1 mPa·s or more and 100 mPa·s or less, more preferably 1 mPa·s or more and 50 mPa·s or less, and even more preferably 1 mPa·s or more and 12 mPa·s or less.

With the viscosity of the curable composition (A1) being 1000 mPa·s or less, or the viscosity of the curable composition (A2) being 100 mPa·s or less, the spreading and filling promptly complete when the curable compositions (A1) and (A2) are brought into contact with the mold. That is to say, the use of the curable compositions according to the present embodiment enables the optical nanoimprint method to be performed at a high throughput. Also, pattern defects due to poor filling unlikely occur. Also, with the viscosity being 1 mPa·s or more, coating unevenness unlikely occurs when the curable compositions (A1) and (A2) are applied to the substrate. Moreover, the curable compositions (A1) and (A2) are unlikely to flow out from the edge of the mold when the curable compositions (A1) and (A2) are brought into contact with the mold.

<Surface Tensions of Curable Compositions>

Concerning the surface tensions of the curable compositions (A1) and (A2) according to the present embodiment, the compositions of components excluding the solvent (the component (d)) preferably have a surface tension at 23° C. of 5 mN/m or more and 70 mN/m or less, more preferably 7 mN/m or more and 50 mN/m or less, and even more preferably 10 mN/m or more and 40 mN/m or less. The greater the surface tension is, e.g., 5 mN/m or more, the greater the exerted capillary force is, and thus the filling (the spreading and filling) completes in a short time when the curable composition (A1) and/or (A2) is brought into contact with the mold. Also, with the surface tension being 70 mN/m or less, the cured film obtained by curing the curable compositions becomes a cured film having surface smoothness.

In the present embodiment, the surface tension of the curable composition (A1) excluding the solvent (the component (d)) is preferably greater than the surface tension of the curable composition (A2) excluding the solvent (the component (d)). This is because, before the mold contacting step, the pre-spreading of the curable composition (A2) is accelerated (droplets spread over a large area) by the Marangoni effect which will be described below, thus the time required for spreading during the mold contacting step which will be described below is shortened, and, as a result, the filling time is shortened. The Marangoni effect is a phenomenon of free surface movement resulting from a local difference in the surface tension of a liquid. Spreading occurs such that a liquid having a small surface tension covers a larger surface by taking advantage of a difference in surface tension, i.e., surface energy, as driving force. That is to say, by applying the curable composition (A1) having a large surface tension to the entire surface of the substrate and then dripping the curable composition (A2) having a small surface tension, the pre-spreading of the curable composition (A2) is accelerated.

<Contact Angles of Curable Compositions>

Concerning the contact angles of the curable compositions (A1) and (A2) according to the present embodiment, the compositions of components excluding the solvent (the component (d)) preferably have a contact angle of 0° or more and 90° or less and particularly preferably 0° or more and 10° or less with respect to both the substrate surface and the mold surface. When the contact angle is more than 90°, a capillary force acts in the negative direction (a direction in which the contact interface between the mold and the curable compositions shrinks) inside a mold pattern or in a gap between the substrate and the mold, and possibly the filling is not attained. The smaller the contact angle is, the stronger the exerted capillary force is and, thus, the higher the filling rate is. In the present embodiment, as described above, the curable composition (A1) is substantially free of a fluorosurfactant, and the amount of the fluorosurfactant in the curable composition (A2) is 1.1% by mass or less, and thus a small contact angle and preferably a contact angle of 0° or more and 10° or less can be obtained.

<Impurities Concomitantly Present in Curable Compositions>

Preferably, the curable compositions (A1) and (A2) according to the present embodiment contain impurities as little as possible. Impurities as referred to here mean those other than the component (a), the component (b), the component (c), and the component (d) described above. Accordingly, the curable compositions according to the present embodiment are preferably compositions obtained through a purification step. Such a purification step is preferably filtration using a filter, or the like.

When performing filtration using a filter, specifically it is preferable that the component (a), the component (b), and the component (c) described above are mixed and then subjected to filtration by, for example, a filter having a pore size of 0.001 μm or more and 5.0 μm or less. Filtration using a filter is more preferably performed at multiple stages or repeated multiple times. Also, the filtrate may be subjected to filtration again. Filtration may be performed using a plurality of filters having different pore sizes. As a filter for use in filtration, a filter made of a polyethylene resin, a polypropylene resin, a fluororesin, a nylon resin, or the like is usable, but the filter is not particularly limited. By way of such a purification step, impurities such as particles concomitantly present in the curable compositions can be removed. Accordingly, it is possible to prevent pattern defects resulting from irregularities unintentionally formed in the cured film obtained after curing the curable compositions due to impurities such as particles.

When the curable compositions according to the present embodiment are used to manufacture a semiconductor integrated circuit, it is preferable to avoid impurities containing metal atoms (metal impurities) from being concomitantly present in the curable compositions as much as possible so as not to inhibit the operation of a product. In such a case, the concentration of metal impurities contained in the curable compositions is preferably 10 ppm or less, and more preferably 100 ppb or less.

[Substrate]

The substrate to receive an underlayer is a processing substrate, and a silicon wafer is usually used. The surface of the substrate may have a processing layer. The substrate may further have another layer that is formed under a processing layer. The use of a quartz substrate as the substrate enables a replica of a quartz imprint mold (a mold replica) to be produced. However, the substrate is not limited to a silicon wafer or a quartz substrate. The substrate can also be suitably selected from those known as semiconductor device substrates composed of aluminum, titanium-tungsten alloy, aluminum-silicon alloy, aluminum-copper-silicon alloy, silicon oxide, silicon nitride, or the like. The surface of the substrate or the processing layer to be used may be subjected to a surface treatment such as a silane coupling treatment, a silazane treatment, or formation of an organic thin film to have an increased adhesion to the curable compositions (A1) and (A2).

[Underlayer]

The underlayer material contains a main agent (a component (P)) and an organic solvent (a component (Q)). The underlayer material may contain an acid generator (a component (R)) and/or a crosslinking agent (a component (S)) and/or a binder (a component (T)) and, as long as the effects of the present invention are not impaired, may contain other optional components. Below, the respective components will now be described.

<Component (P): Main Agent>

The component (P) is a main agent. The component (P) is a compound having an aromatic ring such as a benzene ring, a naphthalene ring, or an anthracene ring, and preferably has a formula weight of 300 to 5,000 and particularly preferably a formula weight of 500 to 2,500. When the molecular weight is 300 or more, good film formability is obtained, and there is no possibility of apparatus contamination resulting from increased sublimates during curing. When the molecular weight is 5,000 or less, good embedding/flattening characteristics can be obtained.

The component (P) may contain a branched or cyclic saturated or unsaturated hydrocarbon group or heteroaromatic group, and may contain an ether group, a hydroxyl group, an ester group, a carbonyl group, an amino group, a halogen group, a sulfide group, a carboxyl group, a sulfo group, an amide group, an imide group, a cyano group, an aldehyde group, an imino group, a urea group, a carbamate group, a carbonate group, a nitro group, or a sulfonyl group.

Specific examples of the component (P) include novolac compounds such as phenol novolak, cresol novolak, and naphthol novolak, and substituted polystyrene compounds such as polyhydroxystyrene and polyhydroxyvinylnaphthalene.

In the present invention, one component (P) may be used singly, or two or more may be used as a mixture.

<Component (Q): Solvent>

The component (Q) is a solvent. The component (Q) is not particularly limited as long as it can dissolve or disperse the component (P) and optional components contained as necessary. Examples of the component (Q) include alcohol solvents, ketone solvents, ether solvents, ester solvents, and nitrogen-containing solvents. One component (Q) can be used singly, or two or more can be used in combination.

Examples of alcohol solvents include monoalcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, and cresol, and polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerin.

Examples of ketone solvents include acetone, methylethyl ketone, methyl-n-propyl ketone, methyl-n-butyl ketone, diethyl ketone, methyl-iso-butyl ketone, methyl-n-pentyl ketone, ethyl-n-butyl ketone, methyl-n-hexyl ketone, di-iso-butyl ketone, trimethylnonanone, cyclohexanone, methylcyclohexanone, 2,4-pentanedione, acetonyl acetone, diacetone alcohol, acetophenone, and fenchone.

Examples of ether solvents include ethylether, iso-propylether, n-butyl ether, n-hexylether, 2-ethylhexylether, ethylene oxide, 1,2-propylene oxide, dioxolane, 4-methyl dioxolane, dioxane, dimethyl dioxane, 2-methoxy ethanol, 2-ethoxy ethanol, ethylene glycol diethylether, 2-n-butoxyethanol, 2-n-hexoxyethanol, 2-phenoxyethanol, 2-(2-ethylbutoxy)ethanol, ethylene glycol dibutylether, diethylene glycol monomethyl ether, diethylene glycol monoethylether, diethylene glycol diethylether, diethylene glycol mono-n-butylether, diethylene glycol di-n-butylether, diethylene glycol mono-n-hexylether, ethoxy triglycol, tetraethylene glycol di-n-butylether, 1-n-butoxy-2-propanol, 1-phenoxy-2-propanol, propylene glycol monomethylether, propylene glycol monoethyl ether, propylene glycol monopropylether, dipropylene glycol monomethylether, dipropylene glycol monoethylether, dipropylene glycol monopropylether, tripropylene glycol monomethylether, tetrahydrofuran, and 2-methyltetrahydrofuran.

Examples of ester solvents include diethyl carbonate, methyl acetate, ethyl acetate, amyl acetate y-butyrolactone, y-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethylether acetate, ethylene glycol monoethylether acetate, diethylene glycol monomethylether acetate, diethylene glycol monoethylether acetate, diethylene glycol mono-n-butylether acetate, propylene glycol monomethylether acetate, propylene glycol monoethylether acetate, propylene glycol monopropylether acetate, propylene glycol monobutylether acetate, dipropylene glycol monomethylether acetate, dipropylene glycol monoethylether acetate, glycol diacetate, methoxytriglycol acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Examples of nitrogen-containing solvents include N-methylformamide, N,N-dimethylformamide, N,N-diethylformamide, acetamide, N-methyl acetamide, N,N-dimethylacetamide, N-methylpropionamide, and N-methylpyrrolidone.

Among these, ether solvents and ester solvents are preferable, and from the viewpoint of excellent film formability, ether solvents and ester solvents having a glycol structure are more preferable, propylene glycol monomethylether, propylene glycol monoethylether, propylene glycol monopropylether, propylene glycol monomethylether acetate, propylene glycol monoethylether acetate, and propylene glycol monopropyl ether acetate are even more preferable, and propylene glycol monomethylether acetate is particularly preferable.

<Component (R): Acid Generator>

The underlayer material according to the present embodiment may contain an acid generator as the component (R). The component (R) is a component that generates acid due to the action of heat or light and promotes the crosslinking reaction of the component (P) by a crosslinking agent (the component (S)) which will be described below. When the composition for forming a resist underlying film contains the component (R), the crosslinking reaction of the component (P) is promoted, and the hardness of the formed film can be further increased. One component (R) can be used singly, or two or more can be used in combination.

Examples of the component (R) include onium salt compounds and N-sulfonyloxyimide compounds.

Examples of the onium salt compounds include sulfonium salts, tetrahydrothiophenium salts, iodonium salts, and ammonium salts.

Examples of sulfonium salts include triphenylsulfonium trifluoromethanesulfonate, triphenyl sulfonium nonafluoro-n-butanesulfonate, triphenylsulfonium 2-bicyclo[2.2.1]hept-2-yl-1,1,2,2-tetrafluoroethanesulfonate, and 4-cyclohexylphenyldiphenylsulfonium trifluoromethanesulfonate.

Examples of tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, and 1-(4-n-butoxynaphthalen-1-yl)tetrahydrothiophenium 2-bicyclo[2.2.1]hept-2-yl-1,1,2,2-tetrafluoroethane sulfonate.

Examples of iodonium salts include diphenyliodonium trifluoromethanesulfonate, diphenyliodonium nonafluoro-n-butanesulfonate, bis(4-t-butylphenyl)iodonium nonafluoro-n-butanesulfonate, and bis(4-t-butylphenyl)iodonium 2-bicyclo[2.2.1]hept-2-yl-1,1,2,2-tetrafluoroethanesulfonate.

Examples of ammonium salts include triethylammonium trifluoromethanesulfonate and triethylammonium nonafluoro-n-butanesulfonate.

Examples of N-sulfonyloxyimide compounds include N-(trifluoromethanesulfonyloxy)bicyclo[2.2.1]hept-5-ene-2,3-dicarboximide, N-(nonafluoro-n-butanesulfonyloxy)bicyclo[2.2.1]hept-5-ene-2,3-dicarboximide, and N-(2-bicyclo[2.2.1]hept-2-yl-1,1,2,2-tetrafluoroethanesulfonyloxy) bicyclo[2.2.1]hept-5-ene-2,3-dicarboximide.

Among these, as for the component (R), onium salt compounds are preferable, an iodonium salt and an ammonium salt are more preferable, and bis(4-t-butylphenyl) iodonium nonafluoro-n-butanesulfonate and triethylammonium nonafluoro-n-butane sulfonate are even more preferable.

When the underlayer material contains the component (R), the lower limit of the content of the component (R) is preferably 0.1 parts by mass, more preferably 1 part by mass, and even more preferably 3 parts by mass based on 100 parts by mass of the component (P). The upper limit of the content is preferably 15 parts by mass, more preferably 12 parts by mass, and even more preferably 10 parts by mass. With the content of the component (R) being within the above range, the crosslinking reaction of the component (P) can be promoted more effectively.

<Component (S): Crosslinking Agent>

The underlayer material according to the present embodiment may contain a crosslinking agent as the component (S). The component (S) is a component that forms a crosslinking bond between the compounds contained in the component (P) in the underlayer material or that forms a crosslinked structure by itself due to the action of heat or acid. When the underlayer material contains the component (S), the hardness of the formed underlayer can be increased. One component (S) can be used singly, or two or more can be used in combination.

Examples of the component (S) include polyfunctional (meth)acrylate compounds, epoxy compounds, hydroxymethyl group-substituted phenol compounds, alkoxyalkyl group-containing phenol compounds, and compounds having an alkoxyalkylated amino group.

Examples of the polyfunctional (meth)acrylate compounds include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, and bis(2-hydroxyethyl)isocyanurate di(meth)acrylate.

Examples of the epoxy compounds include novolac epoxy resins, bisphenol epoxy resins, alicyclic epoxy resins, and aliphatic epoxy resins.

Examples of the hydroxymethyl group-substituted phenol compounds include 2-hydroxymethyl-4,6-dimethylphenol, 1,3,5-trihydroxymethylbenzene, and 3,5-dihydroxymethyl-4-methoxytoluene[2,6-bis(hydroxymethyl)-p-cresol].

Examples of the alkoxyalkyl group-containing phenol compounds include methoxymethyl group-containing phenol compounds and ethoxymethyl group-containing phenol compounds.

Examples of the compounds having an alkoxyalkylated amino group include nitrogen-containing compounds having a plurality of active methylol groups within one molecule wherein at least one hydrogen atom of the hydroxyl group of the methylol group thereof is replaced by an alkyl group such as a methyl group or a butyl group, e.g., (poly) methylolated melamines such as hexamethoxymethylated melamine, hexabutoxymethylated melamine, alkoxy and/or hydroxy-substituted products thereof, and partial self-condensates thereof, (poly)methylolated glycolurils such as tetramethoxymethylated glycoluril, tetrabutoxymethylated glycoluril, alkoxy and/or hydroxy-substituted products thereof, and partial self-condensates thereof, (poly)methylolated benzoguanamines such as tetramethoxymethylated benzoguanamine, tetrabutoxymethylated benzoguanamine, alkoxy and/or hydroxy-substituted products thereof, and partial self-condensates thereof, and (poly)methylolated ureas such as dimethoxymethylated dimethoxyethylene urea, alkoxy and/or hydroxy-substituted products thereof, and partial self-condensates thereof. The compound having an alkoxyalkylated amino group may be a mixture of a plurality of substituted compounds, or may be a compound containing an oligomer component that is partially self-condensed.

When the underlayer material contains the component (S), the lower limit of the content of the component (S) is preferably 0.1 parts by mass, more preferably 0.5 parts by mass, even more preferably 1 part by mass, and particularly preferably 3 parts by mass based on 100 parts by mass of the component (P). The upper limit of the content is preferably 50 parts by mass, more preferably 40 parts by mass, even more preferably 30 parts by mass, and particularly preferably 20 parts by mass. With the content of the component (S) being within the above range, the crosslinking reaction of the component (P) can be more effectively induced.

<Component (T): Binder>

The underlayer material according to the present embodiment may contain a binder as the component (T). The component (T) can be added to the underlayer composition in order to increase adhesion between the substrate and the resist, or that is to say, in order to reduce separation of the resist on the substrate in the mold releasing step which will be described below.

Herein, the component (T) means a compound capable of binding to the curable compositions. When the ethylenically unsaturated group of the curable composition (A1) and/or (A2) undergoes photo radical polymerization in the light irradiation step, a compound containing a hydrogen-donating functional group causes a chain transfer reaction, thus forms a covalent bond with the ethylenically unsaturated group, and therefore is preferably usable as the component (T) in the present invention. Examples of the hydrogen-donating functional group include a thiol group and an (alkyl)amino group, and a compound having such a functional group is preferably used as the component (T). Polyfunctional thiol compounds and polyfunctional (alkyl) amino compounds are particularly preferable. However, in the present embodiment, as will be described below, the underlayer is preferably a layer in which the proportion of the number of carbon atoms is at least 80% or more based on the total number of atoms excluding hydrogen in the layer after baking being 100%, and accordingly the amount of the component (T) added is preferably 1% to 20% based on the weight of the underlayer being 100%. One component (T) may be used singly, or two or more may be used as a mixture.

Specific examples of a compound that has at least two thiol groups and that can be used as the binder (T) include, but are not limited to, polyfunctional thiol compounds such as bifunctional thiol compounds such as 1,4-bis(3-mercaptobutyryloxy)butane; trifunctional thiol compounds such as 1,3,5-tris(3-mercaptobutyryloxyethyl)-1,3,5-triazine-2,4,6 (1H,3H, 5H)-trione, trimethylolpropane tris(3-mercaptopropionate), and pentaerythritol tris (3-mercaptobutyrate); and tetrafunctional thiols such as pentaerythritol tetrakis(mercaptoacetate), pentaerythritol tetrakis(3-m ercaptobutyrate), and pentaerythritol tetrakis(3-mercaptopropionate).

Specific examples of the compound (A) that has an (alkyl)amino group and that can be used as the component (T) include, but are not limited to, carboxyl group-containing amine compounds such as N-phenylglycine, 1,6-diaminohexane-N,N,N',N'-tetraacetic acid, diethylenetriaminepentaacetic acid, and diethylenetriaminepentaacetic dianhydride; hydroxyl group-containing amine compounds such as N,N,N',N'-tetrakis(2-hydroxyethyl)ethyl enediamine, N,N,N',N'-tetrakis (2-hydroxypropyl)ethylenediamine, N,N,N',N'',N''-pentakis (2-hydroxypropyl)diethylenetriamine; and polyfunctional amine compounds such as N,N,N'',N''-tetraisopropyldiethylenetriamine and N,N,N'', N''-tetrabutyldiethylenetriamine.

The thiol group and the amino group of the binder (T) are functional groups that can also bind to the substrate and the component (P). The thiol group and the amino group of the binder (T) form any chemical bond such as a covalent bond, a hydrogen bond, or an intermolecular force with a functional group present on the substrate surface in the underlayer forming step which will be described below. Accordingly, adhesion between the underlayer and the substrate can be increased.

Examples of other optional components include surfactants. When the underlayer material contains a surfactant, coatability can be increased and, as a result, the coating surface uniformity of the formed underlayer film is increased, and formation of coating irregularities can be suppressed. One surfactant can be used singly, or two or more can be used in combination.

When the underlayer material contains a surfactant, the lower limit of the surfactant content is preferably 0.01 parts by mass, more preferably 0.05 parts by mass, and even more preferably 0.1 parts by mass based on 100 parts by mass of the main agent (P). The upper limit of the content is preferably 10 parts by mass, more preferably 5 parts by mass, and even more preferably 1 part by mass. With the surfactant content being within the above range, the coatability of the underlayer material can be further increased.

A commercially available underlayer material is also usable in the present invention. Examples include, but are not limited to, compositions for forming a spin-on carbon film manufactured by Shin-Etsu Chemical Co., Ltd. ODL-50 (a carbon content after baking of 80% by mass), ODL-69 (a carbon content after baking of 86% by mass), ODL-102 (a carbon content after baking of 80% by mass), and ODL-180 (a carbon content after baking of 80% by mass), and compositions for forming a spin-on carbon film manufactured by JSR Corporation, such as NFC-1400 and HM8005. The underlayer material may be composed of one composition, or may be composed of a plurality of compositions.

A mask material referred to as an underlayer is applied to the substrate according to the present embodiment. In the current process of reducing the size of semiconductors, in addition to reducing the size, the resist is formed into a thin film. Moreover, an increased aspect ratio of a processing pattern causes a phenomenon of a lowered etching rate called a microloading effect. Accordingly, the etching time is increased, and the resist mask cannot withstand. In order to highly accurately form a fine pattern having a high aspect ratio, methods such as a multilayer resist process and an inversion process are used. In these methods, a resist pattern is once transferred to a layer that is different from a resist and that has high etching resistance (a high etching resistance layer), and then the target underlayer is processed using the high etching resistance layer as an etching mask.

The underlayer is preferably a layer that is easily processable, that is resistant to an etching process for processing a substrate or another layer that serves as a foundation for the underlayer, and in which the proportion of the number of carbon atoms is at least 80% or more based on the total number of atoms excluding hydrogen in the underlayer after baking being 100%. The underlayer may be formed on the outermost layer of the substrate on which a nanoimprint process is performed, and, for example, carbon materials such as SOC, diamond-like carbon, and graphite can be used. Generally, SOC containing carbon as a main component is used as a material highly resistant to etching. In nanoimprint pattern formation as well, SOC can be used as a material highly resistant to etching. In the present embodiment, a nanoimprint process is preferably performed on a SOC layer.

When the proportion of the number of carbon atoms relative to the total number of atoms excluding hydrogen in the underlayer after baking is 80% or more, the substrate and the curable compositions (A1) and (A2) can firmly adhere after the curable compositions are cured by the light irradiation step. The proportion of the number of carbon atoms in the underlayer needs to be 80% or more and is preferably 80 to 95%.

The precursor composition of the underlayer is a mixture of a solvent and a carbon material such as a naphthalene compound, and is applied to the substrate by a spin coating method. Usually, the precursor composition is applied so as to have a thickness of 0.1 nm to 1000 nm after baking. The composition is preferably applied in an amount sufficient to impart the substrate surface a uniform flatness. Baking the coated substrate causes the solvent component to volatilize and, moreover, carbonization to progress to yield a carbon film having a proportion of the number of carbon atoms of 80% or more. Baking conditions are suitably adjusted according to the type of the composition used, and, in general, baking at about 200° C. to about 350° C. for about 30 seconds to 90 seconds is preferable, and baking at about 220° C. to about 300° C. for about 45 seconds to 60 seconds is particularly preferable.

When the underlayer after baking is left to stand in air for 1 hour or longer, there is a possibility that the surface state changes, and the angle of contact with the curable compositions is increased. This is considered to be because moisture, volatile organic substances, and the like in air adhere to the underlayer surface. Accordingly, the curable compositions are preferably laminated within 1 hour after baking. When 1 hour or longer has elapsed after baking the underlayer, the surface state can be recovered by performing a rebaking step wherein baking is carried out again. Specifically, baking is preferably performed at about 180° C. or higher for about 30 to 90 seconds. Lamination of the curable compositions is preferably within 1 hour also after rebaking.

[Pattern Forming Method]

Next, a pattern forming method according to the first embodiment will now be described with reference to the schematic cross-sectional views of FIGS. 1A to 1F. A cured film to be obtained by the present embodiment is preferably a film having a pattern with a size of 1 nm or more and 10 mm or less. A film having a pattern with a size of 10 nm or more and 100 μm or less is more preferable. Generally, a pattern forming technique for producing a film having a nano-size (1 nm or more and 100 nm or less) pattern (an uneven structure) by using light is referred to as an optical nanoimprint method. The pattern forming method according to the present embodiment involves an optical nanoimprint method.

<Underlayer Forming Step [1]>

In this step, as shown in FIG. 1A, an underlayer 102 is formed on the surface of a substrate 101 (or the surface of a processing layer when the substrate 101 has the processing layer). For example, the above-described precursor composition of the underlayer according to the present embodiment is laminated (applied) to the substrate 101 and baked to form the underlayer 102. In the present embodiment, a method usable for forming the underlayer 102 is, for example, an inkjet method, a dip coating method, an air knife coating method, a curtain coating method, a wire bar coating method, a gravure coating method, an extrusion coating method, a spin coating method, a slit scanning method, or the like. In the present embodiment, a spin coating method is particularly preferable. When forming the underlayer 102 using a spin coating method, a baking step is performed as necessary to volatilize the solvent component. As for the baking conditions, baking is performed at about 200° C. to about 350° C. for about 30 seconds to about 90 seconds. The baking conditions are suitably adjusted according to the type of the composition used.

The average film thickness of the underlayer 102 varies depending on the application, and is, for example, 0.1 nm or more and 10,000 nm or less, preferably 1 nm or more and 350 nm or less, and particularly preferably 1 nm or more and 250 nm or less.

<Dispensing Steps [2-1], [2-2]>

In this step, as shown in FIGS. 1B and 1C, curable compositions are dispensed onto the underlayer 102 on the substrate 101. The dispensing step includes a first dispensing step wherein a curable composition (A1) 103 substantially free of a fluorosurfactant is dispensed onto the underlayer 102, and a second dispensing step wherein droplets of a curable composition (A2) 104 are dripped onto the curable composition (A1) 103 discretely.

(First Dispensing Step [2-1])

In this step, as shown in FIG. 1B, the curable composition (A1) 103 substantially free of a fluorosurfactant is dispensed onto the underlayer 102. For example, the curable composition (A1) 103 is laminated (applied) to the underlayer 102 to form a coating film. In the present embodiment, a method usable for dispensing the curable composition (A1) 103 is, for example, an inkjet method, a dip coating method, an air knife coating method, a curtain coating method, a wire bar coating method, a gravure coating method, an extrusion coating method, a spin coating method, a slit scanning method, or the like. In the present embodiment, a spin coating method is particularly preferable. When dispensing the curable composition (A1) 103 using a spin coating method, a baking step may be performed as necessary to volatilize the solvent component (d).

The average film thickness of the curable composition (A1) 103 varies depending on the application, and is, for example, 0.1 nm or more and 10,000 nm or less, preferably 1 nm or more and 20 nm or less, and particularly preferably 1 nm or more and 10 nm or less.

(Second Dispensing Step [2-2])

In this step, as shown in FIG. 1C, droplets of the curable composition (A2) 104 are dripped onto the curable composition (A1) 103 discretely. The dispensing method is particularly preferably an inkjet method. Droplets of the curable composition (A2) 104 are preferably dispensed densely onto a portion of the substrate 101 facing a region where depressions are densely present in the mold 106 and dispensed sparsely onto a portion of the substrate 101 facing a region where depressions are sparsely present. Thereby, a remaining film 109 which will be described below can be controlled to have a uniform thickness irrespective of whether the pattern on the mold 106 is dense or sparse.

As described above, the droplets of the curable composition (A2) 104 dispensed in this step promptly spread in droplet spreading directions by the Marangoni effect wherein a difference in surface energy (surface tension) is used as a driving force (pre-spreading 105a). When the curable composition (A1) has substantially no photoreactivity, the component (b) photopolymerization initiator of the curable composition (A2) also migrates to the curable composition (A1) as a result of the mixing of the curable composition (A1) and the curable composition (A2), and the curable composition (A1) acquires photosensitivity for the first time.

<Mold Contacting Step [3]>

In this step, as shown in FIG. 1D, the curable compositions and the mold 106 are brought into contact. For example, the mold 106 having an original pattern for transferring a pattern shape is brought into contact with a liquid obtained by mixing the curable composition (A1) and the curable composition (A2). Accordingly, the depressions of a fine pattern provided on the surface of the mold 106 are filled with the liquid obtained by partially mixing the curable composition (A1) and the curable composition (A2), and thus a liquid film that fills the fine pattern of the mold is provided (filling 105b).

As for the mold 106, the mold 106 composed of a light-transmitting material may be used in consideration of the next light irradiation step. Preferable materials constituting the mold 106 are specifically glass, quartz, transparent resins such as PMMA and polycarbonate resin, transparent metal vapor deposited film, flexible film of polydimethylsiloxane or the like, photo-cured film, metal film, and the like. However, when a transparent resin is used as a material constituting the mold 106, a resin that does not dissolve in the components of the curable compositions needs to be selected. Quartz is particularly preferable as a material constituting the mold 106 because the coefficient of thermal expansion is small, and thus the pattern distortion is small.

The fine pattern provided on the surface of the mold 106 preferably has a pattern height of 4 nm or more and 200 nm or less. A smaller pattern height results in a smaller force to separate the mold 106 from the photo-cured film of the resist in the mold releasing step, i.e., a small mold releasing force and, also, a smaller number of mold release defects in which the resist pattern teared as the mold is separated remains on the mask side. In some cases, adjacent resist patterns come into contact with each other due to elastic deformation of the resist patterns caused by an impact exerted when separating the mold, and the resist patterns adhere to each other or become damaged. However, when the pattern height is no more than about twice the pattern width (an aspect ratio of 2 or less), such problems can be highly possibly avoided. On the other hand, an excessively small pattern height results in a poor processing accuracy of the substrate 101.

The mold 106 may be subjected to a surface treatment prior to this step in order to increase separability between the surface of the mold 106 and the curable compositions (A1) and (A2). The surface treatment method may be a method involving applying a mold release agent to the surface of the mold 106 to form a mold release agent layer. Here, examples of the mold release agent applied to the surface of the mold 106 include silicone mold release agents, fluorine mold release agents, hydrocarbon mold release agents, polyethylene mold release agents, polypropylene mold release agents, paraffin mold release agents, montan mold release agents, and carnauba mold release agents. For example, a commercially available coating mold release agent such as OPTOOL (R) DSX manufactured by Daikin Industries, Ltd., can also be suitably used. One mold release agent may be used singly, or two or more may be used in combination. Among these, fluorine and hydrocarbon mold release agents are particularly preferable.

When bringing the mold 106 into contact with the curable compositions (A1) and (A2) in this step, the pressure applied to the curable compositions (A1) and (A2) is not particularly limited. The pressure may be 0 MPa or more and 100 MPa or less. The pressure is preferably 0 MPa or more and 50 MPa or less, more preferably 0 MPa or more and 30 MPa or less, and even more preferably 0 MPa or more and 20 MPa or less.

Since the pre-spreading 105a of the droplets of the curable composition (A2) 104 proceeds in the previous step (the second dispensing step [2-2]), the spreading of the curable composition (A2) 104 in this step promptly completes. As described above, the spreading and the filling 105b of the curable compositions (A1) and (A2) promptly complete in this step, and it is thus possible to set a short time for bringing the mold 106 and the curable compositions (A1) and (A2) into contact. That is to say, one of the effects of the present embodiment is that many pattern forming steps can be completed in a short time and high productivity can be obtained. The contact time is not particularly limited, and may be, for example, 0.1 seconds or more and 600 seconds or less. The time is preferably 0.1 seconds or more and 3 seconds or less, and particularly preferably 0.1 seconds or more and 1 second or less. If the time is shorter than 0.1 seconds, the spreading and the filling are insufficient, and defects referred to as no-fill defects tend to occur frequently.

While this step can be performed under any of an air atmosphere, a reduced pressure atmosphere, and an inert gas atmosphere, a reduced pressure atmosphere or an inert gas atmosphere is preferable because the influence of oxygen and moisture on the curing reaction can be prevented. Specific examples of inert gas usable when performing this step in an inert gas atmosphere include nitrogen, carbon dioxide, helium, argon, various types of Freon gas, and mixed gas thereof. When performing this step in an atmosphere of a specific gas including an air atmosphere, a preferable pressure is 0.0001 atm or more and 10 atm or less.

This step may be performed in an atmosphere containing a condensable gas (hereinafter referred to as a "condensable gas atmosphere"). The condensable gas herein refers to a gas that condenses and liquefies due to capillary pressure produced when filled together with the curable compositions (A1) and (A2) into the depressions of the fine pattern formed on the mold 106 and the gap between the mold 106 and the substrate 101. The condensable gas exists as a gas in the atmosphere before the curable compositions (A1) and (A2) and the mold 106 are brought into contact in this step. When this step is performed in a condensable gas atmosphere, the gas filled in the depressions of the fine pattern is liquefied by the capillary pressure produced by the curable compositions (A1) and (A2) and thus bubbles are eliminated, and therefore excellent fillability is attained. The condensable gas may be dissolved in the curable composition (A1) and/or (A2).

The boiling point of the condensable gas is not limited as long as it is not higher than the ambient temperature of this step, and is preferably −10° C. to 23° C. and more preferably 10° C. to 23° C. With the boiling point being within this range, even better fillability is attained. The ambient temperature of this step is not particularly limited, and is preferably 20° C. to 25° C.

The vapor pressure of the condensable gas at the ambient temperature in this step is not limited as long as it is not higher than the mold pressure during pressing in this step, and is preferably 0.1 to 0.4 MPa. With the vapor pressure being within this range, even better fillability is attained. When the vapor pressure at the ambient temperature is higher than 0.4 MPa, there is a tendency that the bubble eliminating effect cannot be sufficiently obtained. On the other hand, when the vapor pressure at the ambient temperature is lower than 0.1 MPa, pressure reduction is required, and the apparatus tends to be complex.

Specific examples of the condensable gas include fluorocarbons such as chlorofluorocarbon (CFC) such as trichlorofluoromethane, fluorocarbon (FC), hydrofluorocarbon (HFC) such as hydrochlorofluorocarbon (HCFC) and 1,1,1,3,3-pentafluoropropane ($CHF_2CH_2CF_3$, HFC-245fa, PFP), and hydrofluoroether (HFE) such as pentafluoroethyl methylether ($CF_3CF_2OCH_3$, HFE-245mc). Among these, 1,1,1,3,3-pentafluoropropane (a vapor pressure at 23° C. of 0.14 MPa, a boiling point of 15° C.), trichlorofluoromethane (a vapor pressure at 23° C. of 0.1056 MPa, a boiling point of 24° C.), and pentafluoroethyl methylether are preferable from the viewpoint of excellent fillability at an ambient temperature of 20° C. to 25° C. in this step. Moreover, 1,1,1,3,3-pentafluoropropane is particularly preferable from the viewpoint of excellent safety.

One condensable gas may be used singly, or two or more may be used as a mixture. These condensable gases may be used as a mixture with a non-condensable gas such as air, nitrogen, carbon dioxide, helium, or argon. The non-condensable gas to be mixed with the condensable gas is preferably helium from the viewpoint of fillability. Helium can pass through the mold 106. Thus, when the depressions of the fine pattern formed on the mold 106 are filled with gases in the atmosphere (condensable gas and helium) together with the curable composition (A1) and/or (A2) in this step, the condensable gas liquefies and, also, helium passes through the mold 106.

<Light Irradiation Step [4]>

In this step, as shown in FIG. 1E, the curable compositions are irradiated with light to form a cured film. For example, a layer in which the curable composition (A1) 103 and the curable composition (A2) 104 are partially mixed is irradiated with light through the mold 106. More specifically, the curable composition (A1) and/or (A2) filled in the fine pattern of the mold 106 is irradiated with light 107 through the mold 106. Accordingly, the curable composition (A1) and/or (A2) filled in the fine pattern of the mold 106 is cured by the irradiated light to become a cured film 108 having a pattern shape.

Here, the irradiated light 107 is selected according to the sensitivity wavelengths of the curable compositions (A1) and (A2). Specifically, it is preferable to suitably select and use ultraviolet light having a wavelength of 150 nm or more and 400 nm or less, X-rays, electron rays, or the like. Among these, the irradiated light 107 is particularly preferably ultraviolet light. This is because many commercially available curing aids (photopolymerization initiators) are compounds sensitive to ultraviolet light. Here, examples of light sources that emit ultraviolet light include a high pressure mercury lamp, an ultra-high pressure mercury lamp, a low pressure mercury lamp, a Deep-UV lamp, a carbon arc lamp, a chemical lamp, a metal halide lamp, a xenon lamp, a KrF excimer laser, an ArF excimer laser, and a $F_2$ excimer laser, and an ultra-high pressure mercury lamp is particularly preferable. One or more light sources may be used. Also, the entire surface or only a portion of the curable composition (A1) and/or (A2) filled in the fine pattern of the mold may be irradiated with light. The entire region of the substrate may be intermittently irradiated with light multiple times, or the entire region may be continuously irradiated. Moreover, a portion A may be irradiated in a first irradiation process, and a portion B different from the portion A may be irradiated in a second irradiation process.

In this step, as described above, leaking light, i.e., diffusion of light to the outside of the shot region is unavoidable due to the cost restrictions of the mold and the apparatus. In this embodiment, when the curable composition (A1) has substantially no photoreactivity, the curable composition (A1) alone is not cured by light irradiation. Thus, the curable composition (A1) on adjacent shot regions is not cured by leaking light resulting from the shot. Thus, in adjacent shots as well, patterns barely having no-fill defects can be formed in a short filling time in the entire regions thereof. On the other hand, in the shot, as described above, as a result of the mixing of the curable composition (A1) and the curable composition (A2), a photoinitiator (b2) component of the curable composition (A2) also migrates to the curable composition (A1). As a result, the curable composition (A1) acquires photosensitivity, thus both curable compositions (A1) and (A2) are cured by irradiated light to become the cured film 108 having a pattern shape.

<Mold Releasing Step [5]>

In this step, as shown in FIG. 1F, the cured film 108 is separated from the mold 106. For example, the cured film 108 having a pattern shape is separated from the mold 106, and thus the cured film 108 having a pattern shape that is inverted with respect to the fine pattern formed on the mold 106 is obtained in a self-supporting state. A cured film also remains in the depressions of the uneven pattern of the cured film 108 having a pattern shape, this film is referred to as a remaining film 109.

In the case where the mold contacting step [3] is performed in a condensable gas atmosphere, the condensable gas vaporizes as the pressure at the interface where the cured film 108 and the mold 106 are in contact decreases when the cured film 108 is separated from the mold 106 in this step. Accordingly, there is a tendency that the effect of reducing the mold releasing force required to separate the cured film 108 from the mold 106 is exerted.

The method for separating the cured film 108 having a pattern shape from the mold 106 is not particularly limited as long as a part of the cured film 108 having a pattern shape is not physically damaged during separation, and various conditions and the like are also not particularly limited. For example, the substrate 101 may be secured, and the mold 106 may be moved away from the substrate 101 and separated. Alternatively, the mold 106 may be secured, and the substrate 101 may be moved away from the mold 106 and separated. Also, both of these may be pulled in the opposite directions and separated.

By a series of steps (a manufacturing process) having the above steps [2-1] to [5] and preferably steps [1] to [5] in this order, a cured film having a desired uneven pattern shape (a pattern shape derived from the uneven shape of the mold 106) at a desired position can be obtained.

In the pattern shape forming method of the present embodiment, it is possible that the curable composition (A1) is laminated at once on most of the substrate surface in the step [2-1], and then the repeating unit (shot) composed of the steps [2-2] to [5] is repeated multiple times on the same substrate. Also, the steps [2-1] to [5] may be repeated multiple times on the same substrate. By repeating the repeating unit (shot) composed of the steps [2-1] to [5] or the steps [2-2] to [5] multiple times, the cured film 108 having a plurality of desired uneven pattern shapes (pattern shapes derived from the uneven shape of the mold 106) at a desired position of the substrate can be obtained.

Second Embodiment

The pattern forming method of the second embodiment is the same as that of the first embodiment except that the dispensing step is different. Below, the difference of the pattern forming method according to the second embodiment from the first embodiment will now be described with reference to the schematic cross-sectional views of FIGS. 2A to 2E.

<Dispensing Step [2]>

In this step, as shown in FIG. 2B, a curable composition (A3) 110 having a fluorosurfactant concentration of 0.26% by mass or less in the components excluding the solvent is dispensed onto the underlayer 102. Droplets of the curable composition (A3) 110 may be dispensed discretely, or the curable composition (A3) 110 may be laminated (applied) to form a coating film. In the present embodiment, a method usable for dispensing the curable composition (A3) 110 is, for example, an inkjet method, a dip coating method, an air knife coating method, a curtain coating method, a wire bar coating method, a gravure coating method, an extrusion coating method, a spin coating method, a slit scanning method, or the like. When dispensing the curable composition (A3) 110 discretely, an inkjet method is particularly preferable, and when applying the curable composition (A3) 110, a spin coating method is particularly preferable.

With the amount of the fluorosurfactant in the components excluding the solvent of the curable composition (A3) being 0.26% by mass or less and preferably 0.2% by mass or less, the contact angle of the curable composition can be reduced even on an underlayer having a proportion of the number of carbon atoms of 80% or more and, in particular, a SOC film. Other than the amount of the fluorosurfactant, the curable composition (A3) is the same as the curable composition (A2) of the first embodiment.

<<Method for Manufacturing Circuit Board, Electronic Component, and Optical Instrument>>

By using the cured film 108 having a pattern shape obtained by the pattern forming method of the present invention as a mask, the substrate 101 (or the processing layer if the substrate 101 has a processing layer) can be processed to have a pattern by a processing means such as etching. Also, after a processing layer is further formed on the cured film 108 having a pattern shape, pattern transfer may be performed using a processing means such as etching. Thus, a circuit structure based on the pattern shape of the cured film 108 having a pattern shape can be formed on the substrate 101. Accordingly, a circuit board for use in semiconductor elements or the like can be manufactured. Also, by connecting the circuit board to, for example, a circuit control mechanism for the circuit board, an electronic instrument such as a display apparatus, a camera, or a medical apparatus can be formed. Examples of semiconductor elements here include LSI, system LSI, DRAM, SDRAM, RDRAM, D-RDRAM, and NAND flash.

An optical component can also be obtained by using the cured film 108 having a pattern shape obtained by the pattern forming method of the present invention as an optical member such as a diffraction grating or a polarizing plate (including the case where the cured film is used as a part of the optical member). In such a case, an optical component having at least the substrate 101 and the cured film 108 having a pattern shape on the substrate 101 can be obtained.

EXAMPLES

Below, the present invention will now be described in more detail by way of Examples, but the technical scope of the present invention is not limited to the Examples described below. Unless specified otherwise, "part" and "%" used below are based on mass.

The components used in the Examples and Comparative Examples are as follows.

(1) Component (a)
a1: Trimethylolpropane triacrylate (manufactured by Aldrich, abbreviated as TMPTA)
a2: Isobornyl acrylate (manufactured by Kyoeisha Chemical Co., Ltd., trade name: IB-XA)
a3: Benzyl acrylate (manufactured by Osaka Organic Chemical Industry Ltd., trade name: V #160)
a4: Neopentyl glycol diacrylate (manufactured by Kyoeisha Chemical Co., Ltd., trade name: NP-A)
(2) Component (b)
b1: 2,4,6-Trimethylbenzoyldiphenylphosphine oxide (Lucirin(R) TPO (manufactured by BASF)): 3 parts by mass
(3) Component (c)
c1: Pentadecaethylene glycol mono-1H,1H,2H,2H-perfluorooctylether ($F(CF_2)_6CH_2CH_2(OCH_2CH_2)_{15}OH$) (manufactured by DIC Corporation, abbreviated as DEO-15)
c2: Ethylene oxide/propylene oxide copolymer (manufactured by BASF, trade name: Pluronic PE6400)
(4) Component (d)
d1: Propylene glycol monomethylether acetate (manufactured by Tokyo Chemical Industry Co., Ltd., abbreviated as PGMEA)

[Preparation of Curable Composition]

Preparation Example 1

100 parts by mass of a component (a1) and 33000 parts by mass of a component (d1) were mixed, and filtered through a 0.2 μm ultra-high molecular weight polyethylene filter to prepare a curable composition 1.

Preparation Examples 2 to 7

Curable compositions 2 to 7 were prepared in the same manner as in Preparation Example 1 except that the components shown in Table 1 were used.

TABLE 1

| | | Preparation Example 1 | Preparation Example 2 | Preparation Example 3 | Preparation Example 4 | Preparation Example 5 | Preparation Example 6 | Preparation Example 7 |
|---|---|---|---|---|---|---|---|---|
| Component (a) | a1 [part by mass] | 100 | 0 | 0 | 0 | 0 | 0 | 0 |
| | a2 [part by mass] | 0 | 9 | 9 | 9 | 9 | 9 | 9 |
| | a3 [part by mass] | 0 | 38 | 38 | 38 | 38 | 38 | 38 |
| | a4 [part by mass] | 0 | 47 | 47 | 47 | 47 | 47 | 47 |
| Component (b) | b1 [part by mass] | 0 | 3 | 3 | 3 | 3 | 3 | 3 |
| | c1 [part by mass] | 0 | 0 | 0.25 | 0.50 | 1.00 | 2.00 | 0 |
| Component (c) | c2 [part by mass] | 0 | 0 | 0 | 0 | 0 | 0 | 1.60 |
| Component (d) | d1 [part by mass] | 33000 | 0 | 0 | 0 | 0 | 0 | 0 |
| Fluorosurfactant concentration [% by mass] | | 0 | 0 | 0.26 | 0.51 | 1.02 | 2.02 | 0 |

Example 1

<Formation of Underlayer>

In Examples 1 to 8 and Comparative Examples 1 to 4, a SOC precursor composition obtained by dissolving an active-ingredient naphthalene compound in an organic solvent was applied to a silicon wafer as a substrate by spin coating. The spin coating conditions were 1700 rpm and 25 seconds. Then, the SOC precursor composition was baked on a hot plate to form a SOC film as an underlayer. As for the heating conditions, heating was performed at about 300° C. for about 3 minutes. Thus, an underlayer having a proportion of the number of carbon atoms relative to the total number of atoms of 80% or more and a film thickness of 300 nm or less was formed.

<Evaluation of Contact Angle>

Within 1 hour after baking the underlayer, the curable composition 1 as a curable composition (A1) was applied to the underlayer using a spin coater to give a film of the curable composition 1 having a thickness of about 5 to 10 nm. The spin coating conditions were 1100 rpm and 25 seconds.

Droplets (about 1 μL) of the curable composition 2 as a curable composition (A2) were dripped onto the film of the curable composition 1, and the contact angle of droplets about 10 seconds after being dripped was determined by a θ/2 method using a DropMaster manufactured by Kyowa Interface Science Co., Ltd. Dripping and measurement were performed 5 times, and the arithmetic average was determined to make evaluations according to the following criteria. The contact angle was 2.5° and evaluated as A.

A: Contact angle of 10° or less
B: Contact angle of greater than 10°

<Evaluation of Adhesion>

A film of the curable composition 1 was provided on the underlayer in the same manner as in the "Evaluation of contact angle". Thereon, 2 μL of the curable composition 2 as a curable composition (A2) was dripped. Moreover, a 1 mm thick quartz glass (mold) having a pattern was placed thereon to fill a 35 mm×25 mm region with the curable compositions. Next, light emitted from a UV light source equipped with an ultra-high pressure mercury lamp was irradiated for 200 seconds through an interference filter which will be described below as well as the quartz glass. Thus, a cured film was obtained. The interference filter used during light irradiation was VPF-25C-10-15-31300 (manufactured by Sigmakoki Co., Ltd.). The irradiated light used was ultraviolet light having a single wavelength of 313±5 nm, and the illuminance was 1.0 mW/cm². After light irradiation, the quartz glass was removed, and the presence or absence of peeling of the cured film from the substrate side was visually checked to make evaluations according to the following criteria. As a result, the cured film entirely remained on the substrate side and thus was evaluated as A.

A: No peeling of the cured film occurred over the entire surface of 35 mm×25 mm region from the substrate side.
B: Peeling occurred even on a part of 35 mm×25 mm region from the substrate side.

Examples 2 to 5, Comparative Example 1

The contact angle and adhesion were evaluated in the same manner as in Example 1 except that curable compositions (A2) shown in Table 2 were used. The results are shown in Table 2. As for the contact angle, Examples 2 to 5 as in Example 1 were evaluated as A (10° or less), whereas Comparative Example 1 was evaluated as B (greater than 10°). On the other hand, as for adhesion, Examples 2 to 5 as well as Comparative Example 1 were evaluated as A (the cured film entirely remained on the substrate side).

TABLE 2

|  | Example 1 | Example 2 | Example 3 | Example 4 | Comparative Example 1 | Example 5 |
|---|---|---|---|---|---|---|
| Curable composition (A1) | Composition 1 | Composition 1 | Composition 1 | Composition 1 | Composition 1 | Composition 1 |
| Curable composition (A2) | Composition 2 | Composition 3 | Composition 4 | Composition 5 | Composition 6 | Composition 7 |
| Underlayer | Provided | Provided | Provided | Provided | Provided | Provided |
| Contact angle [°] | 2.5 | 4.1 | 4.7 | 7.8 | 19.6 | 2.4 |
| Contact angle evaluation | A | A | A | A | B | A |
| Adhesion evaluation | A | A | A | A | A | A |

Example 6

<Formation of Underlayer>

An underlayer was formed on a silicon wafer in the same manner as in Example 1.

<Evaluation of Contact Angle>

Within 1 hour after baking the underlayer, droplets (about 1 μL) of the curable composition 2 as a curable composition (A3) was dripped onto the underlayer without forming a film of the curable composition 1 on the underlayer, the contact angle of the droplets after a lapse of about 10 seconds was measured and evaluated in the same manner as in Example 1. The contact angle was 4.9° and evaluated as A.

<Evaluation of Adhesion>

Within 1 hour after baking the underlayer, 2 μL of the curable composition 2 as a curable composition (A3) were dripped onto the underlayer without forming a film of the curable composition 1 on the underlayer, and thereafter adhesion was evaluated in the same manner as in Example 1. The cured film entirely remained on the substrate side and thus was evaluated as A.

Examples 7 to 8, Comparative Examples 2 to 4

The contact angle and adhesion were evaluated in the same manner as in Example 6 except that curable compositions (A3) shown in Table 3 were used. The results are shown in Table 3. As for the contact angle, Examples 7 to 8 as in Example 6 were evaluated as A (10° or less), whereas Comparative Examples 2 to 4 were evaluated as B (greater than 10°). On the other hand, as for adhesion, Examples 7 to 8 as well as Comparative Examples 2 to 4 were evaluated as A (the cured film entirely remained on the substrate side).

Comparative Example 5

<Evaluation of Contact Angle>

Droplets (about 1 μL) of the curable composition 2 were dripped onto a silicon wafer without forming an underlayer on the silicon wafer, and the contact angle of the droplets after a lapse of about 10 seconds was measured and evaluated in the same manner as in Example 1. The contact angle was 4.4° and evaluated as A.

<Evaluation of Adhesion>

2 μL of the curable composition 2 was dripped onto a silicon wafer without forming an underlayer on the silicon wafer, and then adhesion was evaluated in the same manner as in Example 1. The cured film was entirely peeled off from the substrate side and thus evaluated as B.

Comparative Examples 6 to 10

The contact angle and adhesion were evaluated in the same manner as in Comparative Example 1 except that curable compositions shown in Table 4 were used. The results are shown in Table 4. As for the contact angle, Comparative Example 10 was evaluated as A (10° or less), whereas Comparative Examples 6 to 9 were evaluated as B (greater than 10°). On the other hand, as for adhesion, Comparative Examples 6 to 10 were all evaluated as B (peeling from the substrate occurred).

TABLE 3

|  | Example 6 | Example 7 | Comparative Example 2 | Comparative Example 3 | Comparative Example 4 | Example 8 |
|---|---|---|---|---|---|---|
| Curable composition (A3) | Composition 2 | Composition 3 | Composition 4 | Composition 5 | Composition 6 | Composition 7 |
| Underlayer | Provided | Provided | Provided | Provided | Provided | Provided |
| Contact angle [°] | 4.9 | 7.8 | 12.2 | 16.6 | 20.1 | 4.4 |
| Contact angle evaluation | A | A | B | B | B | A |
| Adhesion evaluation | A | A | A | A | A | A |

TABLE 4

|  | Comparative Example 5 | Comparative Example 6 | Comparative Example 7 | Comparative Example 8 | Comparative Example 9 | Comparative Example 10 |
|---|---|---|---|---|---|---|
| Curable composition | Composition 2 | Composition 3 | Composition 4 | Composition 5 | Composition 6 | Composition 7 |
| Underlayer | None | None | None | None | None | None |
| Contact angle [°] | 4.4 | 11.9 | 15.9 | 19.5 | 22.5 | 4.5 |
| Contact angle evaluation | A | B | B | B | B | A |
| Adhesion evaluation | B | B | B | B | B | B |

As described above, a pattern forming method with which the contact angle of a resist is small on a carbon-based layer such as SOC can be provided, and also an underlayer presented below can be formed.

<Formation of Underlayer>

The components used to constitute an underlayer are as follows.

(1) Component (P)
p1: Polyhydroxystyrene (Mw: 3500) (manufactured by Nippon Soda Co., Ltd., product name: VP-2500)

(2) Component (Q)
q1: Propylene glycol monomethylether acetate (manufactured by Tokyo Chemical Industry Co., Ltd., abbreviated as PGMEA)

(3) Component (R)
r1: Bis(4-tert-butylphenyl)iodonium perfluoro-1-butanesulfonate (manufactured by Aldrich)

(4) Component (S)
s1: 1,3,4,6-Tetrakis(methoxymethyl)glycoluril (manufactured by Tokyo Chemical Industry Co., Ltd.)

(5) Component (T)
t1: Trimethylolpropane tris(3-mercaptopropionate) (manufactured by Tokyo Chemical Industry Co., Ltd.)
t2: 1,3,5-Tri s(3-mercaptobutyryloxyethyl)-1,3,5-triazine-2,4,6(1H,3H,5H)-trione (manufactured by Showa Denko K. K., product name: Karenz MT NR1)
t3: Pentaerythritol tetrakis(3-mercaptopropionate) (manufactured by Tokyo Chemical Industry Co., Ltd.)
t4: Pentaerythritol tetrakis(3-mercaptobutyrate) (manufactured by Showa Denko K. K., product name: Karenz MT PE1)
t5: N,N,N"N"-Tetraisopropyldiethylenetriamine (manufactured by Tokyo Chemical Industry Co., Ltd.)
t6: N,N,N"N"-Tetrabutyldiethylenetriamine (manufactured by Tokyo Chemical Industry Co., Ltd.)
t7: Diethylenetriaminepentaacetic acid (manufactured by Tokyo Chemical Industry Co., Ltd.)

TABLE 5

|  |  | Preparation Example 8 | Preparation Example 9 | Preparation Example 10 | Preparation Example 11 | Preparation Example 12 | Preparation Example 13 | Preparation Example 14 |
|---|---|---|---|---|---|---|---|---|
| Component (P) | p1 | 7.20 | 7.60 | 7.60 | 7.2 | 6.8 | 6.4 | 7.92 |
| Component (Q) | q1 | 90 | 90 | 90 | 90 | 90 | 90 | 90 |
| Component (R) | r1 | 0.36 | 0.38 | 0.38 | 0.36 | 0.34 | 0.32 | 0.40 |
| Component (S) | s1 | 1.44 | 1.52 | 1.52 | 1.44 | 1.36 | 1.28 | 1.58 |
| Component (T) | t1 | 1.00 | — | — | — | — | — | — |
|  | t2 | — | 0.5 | — | — | — | — | — |
|  | t3 | — | — | 0.5 | — | — | — | — |
|  | t4 | — | — | — | 1.00 | — | — | — |
|  | t5 | — | — | — | — | 1.5 | — | — |
|  | t6 | — | — | — | — | — | 2 | — |
|  | t7 | — | — | — | — | — | — | 0.1 |

Preparation Examples 8 to 14 in Table 5, which are SOC precursor compositions, are applied to a silicon wafer as a substrate by spin coating. The spin coating conditions are 1700 rpm and 25 seconds. Thereafter, the SOC precursor compositions are baked on a hot plate at 200° C. for 60 seconds to form SOC films as underlayers.

<Evaluation of Contact Angle>

Droplets (about 1 μL) of the curable composition 2 can be dripped onto the SOC film underlayers of Preparation Examples 8 to 14, and the contact angle of the droplets after a lapse of about 10 seconds can be evaluated in the same manner as in Example 1.

<Evaluation of Adhesion>

2 μL of the curable composition 2 as a curable composition (A3) can be dripped onto the SOC films of Preparation Examples 8 to 14, and then adhesion can be evaluated in the same manner as in Example 1.

As described above, the present invention can provide a pattern forming method with which the contact angle of a resist on a carbon-based layer such as SOC is small, a high throughput is attained, and no peeling occurs in a shot region of a substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A pattern forming method comprising in this order:
   a dispensing step of dispensing a curable composition onto an underlayer of a substrate having the underlayer on a surface;
   a mold contacting step of bringing the curable composition into contact with a mold;
   a light irradiation step of irradiating the curable composition with light to form a cured film; and
   a mold releasing step of separating the cured film from the mold,
   wherein proportion of a number of carbon atoms relative to a total number of atoms excluding hydrogen in the underlayer is 80% or more, and
   wherein the dispensing step comprises a first dispensing step of dispensing a liquid curable composition (A1) substantially free of a fluorosurfactant onto the underlayer, and a second dispensing step of dripping a droplet of a curable composition (A2) having a fluorosurfactant concentration in components excluding a solvent of 1.1% by mass or less onto the liquid curable composition (A1) discretely.

2. The pattern forming method according to claim 1, wherein the curable composition (A1) has substantially no photoreactivity.

3. The pattern forming method according to claim 1, wherein surface tension of the curable composition (A1) excluding a solvent is greater than surface tension of the curable composition (A2) excluding the solvent.

4. A pattern forming method comprising in this order:
   a dispensing step of dispensing a curable composition onto an underlayer of a substrate having the underlayer on a surface;
   a mold contacting step of bringing the curable composition into contact with a mold;
   a light irradiation step of irradiating the curable composition with light to form a cured film; and
   a mold releasing step of separating the cured film from the mold,
   wherein a proportion of a number of carbon atoms relative to a total number of atoms excluding hydrogen in the underlayer is 80% or more,
   wherein the dispensing step is a step of dispensing a curable composition having a fluorosurfactant concentration in components excluding a solvent of 0.26% by mass or less onto the underlayer,
   wherein an underlayer composition of the underlayer comprises 1% by mass to 20% by mass of an amino group-containing compound and/or a thiol group-containing compound as a binder based on a weight of the underlayer being 100% by mass, and
   wherein a contact angle of the curable composition on the underlayer is 10° or less.

5. The pattern forming method according to claim 4, comprising an underlayer forming step of forming the underlayer on the surface of the substrate before the dispensing step, the underlayer forming step comprising a baking step of baking the underlayer.

6. The pattern forming method according to claim 5, comprising a rebaking step of rebaking the underlayer between the underlayer forming step and the dispensing step.

7. The pattern forming method according to claim 6, wherein the rebaking step is a step of rebaking the underlayer at 180° C. or higher.

8. The pattern forming method according to claim 6, wherein the dispensing step is initiated within 1 hour after the baking step or the rebaking step.

9. The pattern forming method according to claim 4, wherein the underlayer comprises spin-on carbon.

10. The pattern forming method according to claim 4, wherein a precursor composition of the underlayer comprises a naphthalene compound and an organic solvent.

11. A method for manufacturing a circuit board comprising:
    a step of obtaining a film having a predetermined pattern shape by the pattern forming method according to claim 1; and
    a step of processing the substrate using the pattern shape of the film as a mask.

12. A method for manufacturing a circuit board comprising:
    a step of obtaining a film having a predetermined pattern shape by the pattern forming method according to claim 4; and
    a step of processing the substrate using the pattern shape of the film as a mask.

13. A method for manufacturing an electronic instrument comprising:
    a step of obtaining a circuit board by the method for manufacturing the circuit board according to claim 11; and
    a step of connecting the circuit board and a control mechanism for controlling the circuit board.

14. A method for manufacturing an optical component comprising obtaining a film having a predetermined pattern shape by the pattern forming method according to claim 1.

15. A method for manufacturing an optical component comprising obtaining a film having a predetermined pattern shape by the pattern forming method according to claim 4.

16. A pattern forming method comprising in this order:
    a dispensing step of directly dispensing a curable composition onto spin-on carbon of a substrate having the spin-on carbon on a surface;
    a mold contacting step of bringing the curable composition on the substrate into contact with a mold such that the curable composition is sandwiched between the substrate and the mold;
    a light irradiation step of irradiating the curable composition with light to form a cured film adhered to the spin-on carbon; and
    a mold releasing step of separating the cured film adhered to the spin-on carbon from the mold,
    wherein a proportion of a number of carbon atoms relative to a total number of atoms excluding hydrogen in the spin-on carbon is 80% or more,
    a spin-on carbon composition of the spin-on carbon comprises 1% by mass to 20% by mass of an amino group-containing compound and/or a thiol group-containing compound as a binder based on a weight of the spin-on carbon being 100% by mass, and
    a contact angle of the curable composition on the spin-on carbon is 10° or less.

* * * * *